US012426365B2

(12) United States Patent
Xu et al.

(10) Patent No.: US 12,426,365 B2
(45) Date of Patent: Sep. 23, 2025

(54) DISPLAY SUBSTRATE AND MANUFACTURING METHOD THEREFOR, AND DISPLAY DEVICE

(71) Applicant: BOE Technology Group Co., Ltd., Beijing (CN)

(72) Inventors: Pan Xu, Beijing (CN); Yicheng Lin, Beijing (CN); Ling Wang, Beijing (CN); Guoying Wang, Beijing (CN); Xing Zhang, Beijing (CN); Ying Han, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 815 days.

(21) Appl. No.: 17/298,032

(22) PCT Filed: Oct. 28, 2020

(86) PCT No.: PCT/CN2020/124452
§ 371 (c)(1),
(2) Date: May 28, 2021

(87) PCT Pub. No.: WO2021/083226
PCT Pub. Date: May 6, 2021

(65) Prior Publication Data
US 2022/0102460 A1    Mar. 31, 2022

(30) Foreign Application Priority Data
Oct. 29, 2019 (CN) .......................... 201911038401.5

(51) Int. Cl.
*H10D 86/40* (2025.01)
*H10K 59/121* (2023.01)
(Continued)

(52) U.S. Cl.
CPC ....... *H10D 86/481* (2025.01); *H10K 59/1213* (2023.02); *H10K 59/1216* (2023.02);
(Continued)

(58) Field of Classification Search
CPC ........... H10K 59/1216; H10K 59/1213; H10K 59/126; H10K 71/00; H10K 59/1201;
(Continued)

(56) References Cited

U.S. PATENT DOCUMENTS

2014/0175445 A1  6/2014  Cai et al.
2015/0187854 A1  7/2015  Beak et al.
(Continued)

FOREIGN PATENT DOCUMENTS

CN   103904086 A   7/2014
CN   104752637 A   7/2015
(Continued)

OTHER PUBLICATIONS

International Search Report for PCT/CN/2020/124452 Mailed Jan. 29, 2021.
(Continued)

*Primary Examiner* — Mohammad M Hoque
(74) *Attorney, Agent, or Firm* — Ling Wu; Stephen Yang; Ling and Yang Intellectual Property

(57) ABSTRACT

A display substrate and a manufacturing method therefor, and a display device. The display substrate includes multiple sub-pixels, each sub-pixel including a light-emitting region and a non-light-emitting region, and a driving circuit being provided in each sub-pixel. The driving circuit includes a storage capacitor and multiple transistors. The transistors include a switching transistor, a driving transistor, and a sensing transistor. For each sub-pixel, the transistors are located in the non-light-emitting region, the storage capacitor is a transparent capacitor, and the orthographic projection
(Continued)

of the storage capacitor on a substrate overlaps the light-emitting region. The first electrode of the storage capacitor is arranged on the same layer as the active layer of the transistors, and arranged on a different layer from the source and drain electrodes of the transistors, and the second electrode of the storage capacitor is located on the side of the first electrode close to the substrate.

19 Claims, 17 Drawing Sheets

(51) Int. Cl.
*H10K 59/126* (2023.01)
*H10K 71/00* (2023.01)
*H10D 86/60* (2025.01)
*H10K 59/12* (2023.01)
*H10K 59/131* (2023.01)
*H10K 59/38* (2023.01)

(52) U.S. Cl.
CPC .......... *H10K 59/126* (2023.02); *H10K 71/00* (2023.02); *H10D 86/60* (2025.01); *H10K 59/1201* (2023.02); *H10K 59/131* (2023.02); *H10K 59/38* (2023.02)

(58) Field of Classification Search
CPC .... H10K 59/131; H10K 59/38; H10K 59/124; H10K 59/122; H10K 50/805; H10K 50/844; H10K 77/10; H01L 27/1255; H01L 27/02; H01L 27/0207
USPC .......................................................... 257/40
See application file for complete search history.

(56) References Cited

U.S. PATENT DOCUMENTS

| | | |
|---|---|---|
| 2016/0141349 A1 | 5/2016 | Yun et al. |
| 2018/0122883 A1* | 5/2018 | Beak ...................... H10K 77/10 |
| 2018/0145121 A1 | 5/2018 | Park et al. |
| 2018/0151120 A1 | 5/2018 | Kim et al. |
| 2019/0131369 A1* | 5/2019 | Choi .................... H10K 59/131 |
| 2019/0355802 A1* | 11/2019 | Shim ..................... H10K 59/131 |
| 2020/0098841 A1 | 3/2020 | Song et al. |

FOREIGN PATENT DOCUMENTS

| | | | |
|---|---|---|---|
| CN | 108091672 A | | 5/2018 |
| CN | 108122945 A | | 6/2018 |
| CN | 109273498 A | | 1/2019 |
| CN | 110071069 A | | 7/2019 |
| CN | 110112183 A | | 8/2019 |
| JP | 08184852 A | | 7/1996 |
| JP | 2012208421 A | | 10/2012 |
| KR | 20190128801 A | * | 11/2019 |
| KR | 20200042332 A | * | 4/2020 |

OTHER PUBLICATIONS

Office Action dated Nov. 17, 2021 for Chinese Patent Application No. 201911038401.5 and English Translation.
European Search Report for 20878024.7 Mailed Nov. 23, 2022.
Office Action dated Aug. 26, 2024 for Japanese Patent Application No. 2021-564799 and English Translation.

* cited by examiner

DISPLAY SUBSTRATE AND MANUFACTURING METHOD THEREFOR, AND DISPLAY DEVICE

CROSS-REFERENCE TO RELATED APPLICATION

The present application is a U.S. National Phase Entry of International Application PCT/CN2020/124452 having an international filing date of Oct. 28, 2020 and claims the priority of Chinese Patent Application No. 201911038401.5, filed to the CNIPA on Oct. 29, 2019 and entitled "Display Substrate and Manufacturing Method Therefor, and Display Device", the content of which should be construed as being incorporated into the present application by reference.

TECHNICAL FIELD

The present disclosure relates to the field of display technology, and particularly relates to a display substrate and a method for preparing the display substrate, and a display apparatus.

BACKGROUND

An organic light-emitting diode (abbreviated as OLED) display is a different display technology from a conventional liquid crystal display (abbreviated as LCD), and has advantages such as self-luminescence, good temperature characteristics, low power consumption, high response speed, flexibility, ultra-thinness and low cost. The OLED has become one of the significant discoveries of new generation display apparatus and is attracting growing attention.

OLED display substrates may be categorized into three types according to their light-emitting directions: bottom emission type of OLED, top emission type of OLED and double-sided emission type of OLED. Among them, the bottom emission type of OLED refers to that light from an OLED device is emitted towards a base substrate. However, in the bottom emission type of OLED display substrate, each sub-pixel has to occupy a rather large area due to limitation by the pixel opening region. As a result, the number of pixels per inch (PPI) in the bottom emission type of OLED display substrate is low, preventing a high PPI from being achieved.

SUMMARY

The following is a summary of the subject matter described in detail in the present disclosure. This summary is not intended to limit the protection scope of the claims. In one aspect, the present disclosure provides a display substrate, including a base substrate and multiple sub-pixels disposed on the base substrate, wherein each sub-pixel includes a light-emitting region and a non-light-emitting region, and a drive circuit is disposed in each sub-pixel; the drive circuit includes a storage capacitor and multiple transistors; the multiple transistors include a switch transistor, a drive transistor and a sense transistor.

For each sub-pixel, the multiple transistors are located in the non-light-emitting region, the storage capacitor is a transparent capacitor, and there is an overlapping region between an orthographic projection of the storage capacitor on the base substrate and the light-emitting region. A first electrode of the storage capacitor is disposed in a same layer as an active layer of the multiple transistors and in a different layer from the source and drain electrodes of the multiple transistors, and a second electrode of the storage capacitor is located on a side of the first electrode close to the base substrate.

A first electrode of the drive transistor is electrically connected to the second electrode of the storage capacitor, and a first electrode of the sense transistor is electrically connected to the second electrode of the storage capacitor.

In an exemplary embodiment, the display substrate further includes a buffer layer and a light shield layer disposed on a side of the active layer of the multiple transistors close to the base substrate, wherein the light shield layer and the second electrode of the storage capacitor are disposed on a side of the buffer layer close to the base substrate.

An orthographic projection of the second electrode of the storage capacitor on the base substrate covers an orthographic projection of the light shield layer on the base substrate, and a surface of the light shield layer close to the second electrode of the storage capacitor is in complete contact with the second electrode.

In an exemplary embodiment, the light shield layer is disposed on a side of the second electrode of the storage capacitor close to the base substrate, or the second electrode of the storage capacitor is disposed on a side of the light shield layer close to the substrate.

In an exemplary embodiment, the display substrate further includes an interlayer insulating layer disposed between the source and drain electrodes of the multiple transistors and the active layer of the multiple transistors.

The buffer layer includes a first via hole and a second via hole which exposes the second electrode of the storage capacitor, and the interlayer insulating layer includes a third via hole exposing the first via hole and a fourth via hole exposing the second via hole.

The first electrode of the drive transistor is connected to the second electrode of the storage capacitor through the first via hole and the third via hole, and the first electrode of the sense transistor is connected to the second electrode of the storage capacitor through the second via hole and the fourth via hole.

In an exemplary embodiment, the display substrate further includes multiple rows of gate lines and multiple columns of data lines disposed on the base substrate; wherein each sub-pixel is defined by intersection of a gate line and a data line, and the multiple sub-pixels respectively correspond to the multiple rows of gate lines and the multiple columns of data lines. The multiple rows of gate lines include a first gate line and a second gate line, wherein the first gate line and the second gate line are disposed in a same layer as the gate electrodes of the multiple transistors, and the multiple columns of data lines are disposed in a same layer as the source and drain electrodes of the multiple transistors.

In an exemplary embodiment, for each sub-pixel, the first electrode of the storage capacitor is respectively connected to a first electrode of the switch transistor and a gate electrode of the drive transistor.

A gate electrode of the switch transistor is connected to the first gate line among the gate lines corresponding to the sub-pixel; a second electrode of the switch transistor is connected to a data line corresponding to the sub-pixel; and a gate electrode of the sense transistor is connected to the second gate line among the gate lines corresponding to the sub-pixel.

In an exemplary embodiment, for each sub-pixel, the non-light-emitting region includes a first non-light-emitting region and a second non-light-emitting region, which are located at two sides of the light-emitting region and disposed along an extending direction of the multiple columns of data lines.

The sense transistor and the second gate line are both located in the first non-light-emitting region, and the switch transistor, the drive transistor and the first gate line are all located in the second non-light-emitting region.

In an exemplary embodiment, the display substrate further includes power supply lines and sensing lines disposed in a same layer as the multiple columns of data lines, and each pixel includes four sub-pixels disposed along an extending direction of the gate lines, and each pixel corresponds to two columns of power supply lines and one column of sensing line.

For each pixel, the sensing line corresponding to the pixel is located between a second sub-pixel and a third sub-pixel, one column of the power supply lines corresponding to the pixel is located on a side of a first sub-pixel away from the second sub-pixel, and the other column of the power supply lines corresponding to the pixel is located on a side of a fourth sub-pixel away from the third sub-pixel.

A data line corresponding to the first sub-pixel is located on a side of the first sub-pixel close to the second sub-pixel; a data line corresponding to the second sub-pixel is located on a side of the second sub-pixel close to the first sub-pixel; a data line corresponding to the third sub-pixel is located on a side of the third sub-pixel close to the fourth sub-pixel; and a data line corresponding to the fourth sub-pixel close to the third sub-pixel.

The display substrate further includes power connection lines disposed in a same layer as the gate electrodes of the multiple transistors and sensing connection lines disposed in a same layer as the light shield layer. Each pixel corresponds to two power connection lines disposed along the extending direction of the gate lines and two sensing connection lines disposed along the extending direction of the gate lines. The power connection lines respectively correspond to the power supply lines, and the power connection lines are connected to corresponding power supply lines. The two sensing connection lines are connected to the sensing lines.

A second electrode of the drive transistor of the second sub-pixel is connected to one of the power supply connection lines;

a second electrode of the drive transistor of the third sub-pixel is connected to the other one of the power supply connection lines;

a second electrode of the sense transistor of the first sub-pixel is connected to one of the sensing connection lines; and a second electrode of the sense transistor of the fourth sub-pixel is connected to the other one of the sensing connection lines.

In an exemplary embodiment, the buffer layer is further provided with a fifth via hole exposing the sensing connection line, and the interlayer insulating layer is further provided with a sixth via hole exposing the fifth via hole.

A second electrode of a sense transistor is connected to the sensing connection line through the fifth via hole and the sixth via hole.

In an exemplary embodiment, the display substrate further includes a gate insulating layer disposed between the gate electrodes of the multiple transistors and the active layer of the multiple transistors;

wherein an orthographic projection of the gate insulating layer on the base substrate coincides with an orthographic projection of the gate electrodes of the multiple transistors on the base substrate.

In an exemplary embodiment, manufacturing material of the first electrode of the storage capacitor includes transparent metal oxide, and manufacturing material of the second electrode of the storage capacitor includes a transparent conductive material.

In an exemplary embodiment, each sub-pixel is further provided with a light-emitting element and a filter of a same color as the sub-pixel. The light-emitting element further includes an anode, an organic light-emitting layer and a cathode which are sequentially disposed, wherein the anode is connected to the first electrode of the sense transistor, the anode is a transmission electrode and the cathode is a reflection electrode.

There is an overlapping region between an orthographic projection of the light-emitting element on the base substrate and the light-emitting region, and the filter is located in the light-emitting region and is disposed on a side of the light-emitting element close to the base substrate. An orthographic projection of the anode on the base substrate covers an orthographic projection of the filter on the base substrate.

In an exemplary embodiment, the display substrate further includes a passivation layer and a planarization layer disposed on a side of the source and drain electrodes of the multiple transistors away from the base substrate.

The passivation layer is disposed on a side of the filter close to the base substrate, and the planarization layer is disposed between the light-emitting element and the filter. The passivation layer is provided with a seventh via hole exposing the first electrode of the sense transistor, and the planarization layer is provided with an eighth via hole exposing the seventh via hole.

The anode is connected to the first electrode of the sense transistor through the seventh via hole and the eighth via hole.

An orthographic projection of the eighth via hole on the base substrate does not completely coincide with an orthographic projection of the fourth via hole on the base substrate.

In another aspect, the present disclosure provides a display apparatus including any of the above display substrates.

In another aspect, the present disclosure provides a method for preparing a display substrate, which is used for preparing any of the above display substrates. The method includes:

providing a base substrate; and forming multiple sub-pixels on the base substrate, wherein each sub-pixel includes a light-emitting region and a non-light-emitting region, and a drive circuit is provided in each sub-pixel; the drive circuit includes a storage capacitor and multiple transistors; the multiple transistors include a switch transistor, a drive transistor and a sense transistor.

For each sub-pixel, the multiple transistors are located in the non-light-emitting region, the storage capacitor is a transparent capacitor, and there is an overlapping region between an orthographic projection of the storage capacitor on the base substrate and the light-emitting region. A first electrode of the storage capacitor is disposed in a same layer as an active layer of the multiple transistors and in a different layer from the source and drain electrodes of the multiple transistors, and a second electrode of the storage capacitor is located on a side of the first electrode close to the substrate.

A first electrode of the drive transistor is electrically connected to the second electrode of the storage capacitor, and a first electrode of the sense transistor is electrically connected to the second electrode of the storage capacitor.

In an exemplary embodiment, the display substrate further includes gate lines, a data line, a power supply line and a sensing line, wherein the gate lines includes a first gate line and a second gate line. The step of forming the multiple sub-pixels on the base substrate includes:

forming a light shield layer and the second electrode of the storage capacitor on the base substrate;

forming an active layer of the multiple transistors and the first electrode of the storage capacitor on the light shield layer and the second electrode;

forming gate electrodes of the multiple transistors, the first gate line and the second gate line on the active layer of the multiple transistors and the first electrode of the storage capacitor;

forming the data line, the power supply line, the sensing line and the source and drain electrodes of the multiple transistors on the gate electrodes, the first gate line and the second gate line of the multiple transistors; and sequentially forming a filter and a light-emitting element on the data line, the power supply line, the sensing line and the source and drain electrodes of the multiple transistors.

In an exemplary embodiment, the step of forming the light shield layer and the second electrode of the storage capacitor on the base substrate includes:

sequentially forming the light shield layer and the second electrode of the storage capacitor on the base substrate, or sequentially forming the second electrode of the storage capacitor and the light shield layer on the base substrate, or simultaneously forming the second electrode of the storage capacitor and the light shield layer on the base substrate.

In an exemplary embodiment, the step of simultaneously forming the second electrode of the storage capacitor and the light shield layer on the base substrate includes:

sequentially depositing a light shielding thin film and a transparent conductive thin film on the base substrate; and simultaneously forming the second electrode of the storage capacitor and the light shield layer by using a halftone mask.

In an exemplary embodiment, the steps of forming the active layer of the multiple transistors and the first electrode on the light shield layer and the second electrode of the storage capacitor; forming the gate electrodes of the multiple transistors, the first gate line and second gate line on the active layer of the multiple transistors and the first electrode of the storage capacitor; forming the data line, the power supply line, the sensing line and the source and drain electrodes of the multiple transistors on the gate electrodes of the multiple transistors, the first gate line and the second gate line includes:

forming a buffer layer including a first via hole, a second via hole and a fifth via hole on the light shield layer and the second electrode of the storage capacitor, wherein the first via hole and the second via hole expose the second electrode of the storage capacitor, and the fifth via hole exposes a sensing connection line;

forming the active layer of the multiple transistors and the first electrode of the storage capacitor on the buffer layer by using a same process;

forming the gate electrodes of the multiple transistors, the first gate line and the second gate line on the active layer of the transistors and the first electrode of the storage capacitor;

forming an interlayer insulating layer including a third via hole, a fourth via hole and a sixth via hole on the gate electrodes of the multiple transistors, the first gate line and second gate line, wherein the third via hole exposes the first via hole, the fourth via hole exposes the second via hole, and the sixth via hole exposes the fifth via hole;

forming the data line, the power supply line, the sensing line and the source and drain electrodes of the multiple transistors on the interlayer insulating layer;

or, forming a first insulating thin film on the light shield layer and the second electrode of the storage capacitor;

forming the active layers of the multiple transistors and the first electrode of the storage capacitor on the first insulating thin film by using the same process;

forming the gate electrodes, the first gate line and the second gate line of the multiple transistors on the active layer of the multiple transistors and the first electrode of the storage capacitor;

forming a second insulating thin film on the gate electrodes of the multiple transistors, the first gate line and the second gate line; and processing the first insulating thin film and the second insulating thin film by using a patterning process to form the buffer layer including the first via hole, the second via hole and the fifth via hole and the interlayer insulating layer including the third via hole, the fourth via hole and the sixth via hole.

In an exemplary embodiment, the step of sequentially forming filter and light-emitting element on the data line, the power supply line, the sensing line and the source and drain electrodes of the multiple transistors includes:

forming a passivation layer including a seventh via hole on the data line, the power supply line, the sensing line and the source and drain electrodes of the multiple transistors, wherein the seventh via hole exposes the first electrode of the sense transistor;

sequentially forming the filter and a planarization layer including an eighth via hole on the passivation layer, wherein the eighth via hole exposes the seventh via hole; and forming the light-emitting element on the planarization layer. Other features and advantages of the present application will be set forth in the description which follows, and in part will become apparent from the description, or may be learned by practice of the present application. Other advantages of the present application can be realized and obtained through the solutions described in the description, the claims and the figures.

Other aspects will become apparent upon reading and understanding accompanying drawings and the detailed description.

BRIEF DESCRIPTION OF DRAWINGS

The accompanying drawings are used to provide an understanding of the technical solution of the present application and form a part of the description. Together with the embodiments of the application, they are used to explain the technical solution of the present application and do not constitute a limitation on the technical solution of the present application.

DETAILED DESCRIPTION

Figure 1:
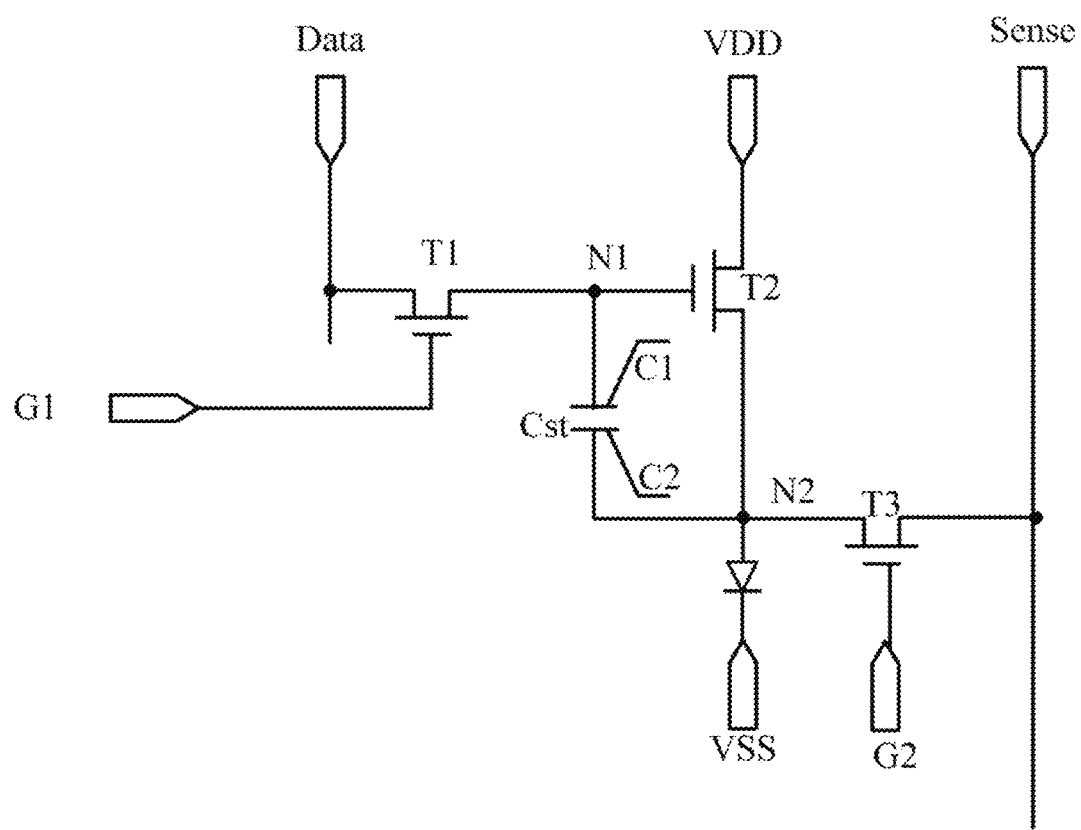
FIG. 1 is an equivalent circuit diagram of a drive circuit.

A plurality of embodiments are described in the present disclosure, but the description is exemplary rather than restrictive, and it is apparent to those of ordinary skills in the art that there may be more embodiments and implementation solutions within the scope of the embodiments described in the present disclosure. Although many possible combinations of features are shown in the accompanying drawings and discussed in the Detailed Description, many other combinations of the disclosed features are also possible. Unless specifically limited, any feature or element of any embodiment may be used in combination with or in place of any other feature or element of any another embodiment.

The present disclosure includes and contemplates combinations of features and elements known to those of ordinary skilled in the art. The disclosed embodiments, features and elements of the present disclosure may be combined with any conventional features or elements to form a unique technical solution defined by the claims. Any feature or element of any embodiment may also be combined with features or elements from other technical solutions to form another unique technical solution defined by the claims. Therefore, it should be understood that any of the features shown and/or discussed in the present disclosure may be implemented individually or in any suitable combination. Therefore, the embodiments are not otherwise limited except in accordance with the appended claims and equivalents thereof. In addition, various modifications and changes can be made within the protection scope of the appended claims.

In addition, when describing representative embodiments, the specification may have presented a method and/or a process as a specific sequence of steps. However, to the extent that the method or process does not depend on the specific order of steps described in the present disclosure, the method or process should not be limited to the specific order of steps described. As those of ordinary skills in the art will understand, other orders of steps are also possible. Therefore, the specific order of steps set forth in the specification should not be interpreted as limitations on the claims. In addition, the claims for the method and/or process should not be limited to performing their steps in the written order, and those of skill in the art may readily understand that these orders may vary and still remain within the spirit and scope of the embodiments of the present disclosure.

Unless otherwise defined, technical terms or scientific terms used in the embodiments of the present disclosure shall have common meanings as construed by those of ordinary skills in the art to which the present disclosure pertains. The words "first", "second" and the like used in the embodiments of the present disclosure do not represent any order, quantity or importance, but are merely used to distinguish among different components. Similar words such as "including" or "comprising" mean that elements or articles appearing before the word cover elements or articles listed after the word and their equivalents, without excluding other elements or articles. Similar words such as "connect" or "link" are not limited to physical or mechanical connections, but may include electrical connections, whether direct or indirect. "Up", "down", "left", "right", etc. are only used to represent a relative position relation that may change accordingly after an absolute position of an object being described is changed.

In the present embodiment, the display substrate includes multiple sub-pixels, wherein each sub-pixel includes a drive circuit and a light-emitting element. FIG. 1 is an equivalent circuit diagram of the drive circuit, illustrating a 3T1C drive circuit. As shown in FIG. 1, the drive circuit is electrically connected to a first gate line G1, a sensing line Sense, a power supply line VDD, a data line Data and a second gate line G2, and the drive circuit includes a switch transistor T1, a drive transistor T2, a sense transistor T3 and a storage capacitor Cst.

In an exemplary embodiment, a gate electrode of the switch transistor T1 is connected to the first gate line G1, the second electrode of the switch transistor T1 is connected to the data line Data, and a first electrode of the switch transistor T1 is connected to node N1. A gate electrode of the drive transistor T2 is connected to the node N1, a second electrode of the drive transistor T2 is connected to the power supply line VDD, and a first electrode of the drive transistor T2 is connected to node N2. A gate electrode of the sense transistor T3 is connected to the second gate line G2, a second electrode of the sense transistor T3 is connected to the sensing line Sense, and a first electrode of the sense transistor T3 is connected to the node N2. An anode of the light-emitting element OLED is connected to the node N2, and a cathode of the light-emitting element OLED is connected to the low power supply line VSS, and the light-emitting element OLED is configured to emit light with corresponding brightness in response to the current of the first electrode of the drive transistor. When the drive circuit turns on the switch transistor T1 through the first gate line G1, a data voltage Vdata provided by the data line Data is stored in the storage capacitor Cst via the switch transistor T1, thereby controlling the drive transistor T2 to generate a current to drive the organic light-emitting diode (OLED) to emit light. In addition, the sense transistor T3 can extract a threshold voltage Vth and a mobility of the drive transistor T2 in response to a sensing timing, and the storage capacitor Cst is configured to maintain a voltage difference between the node N1 and the node N2 in one frame of light emission period.

In an exemplary embodiment, the first electrode of any of the above transistors is one of the source and drain electrodes, and the second electrode of any of the above transistors is the other of the source and drain electrodes.

Figure 2A:
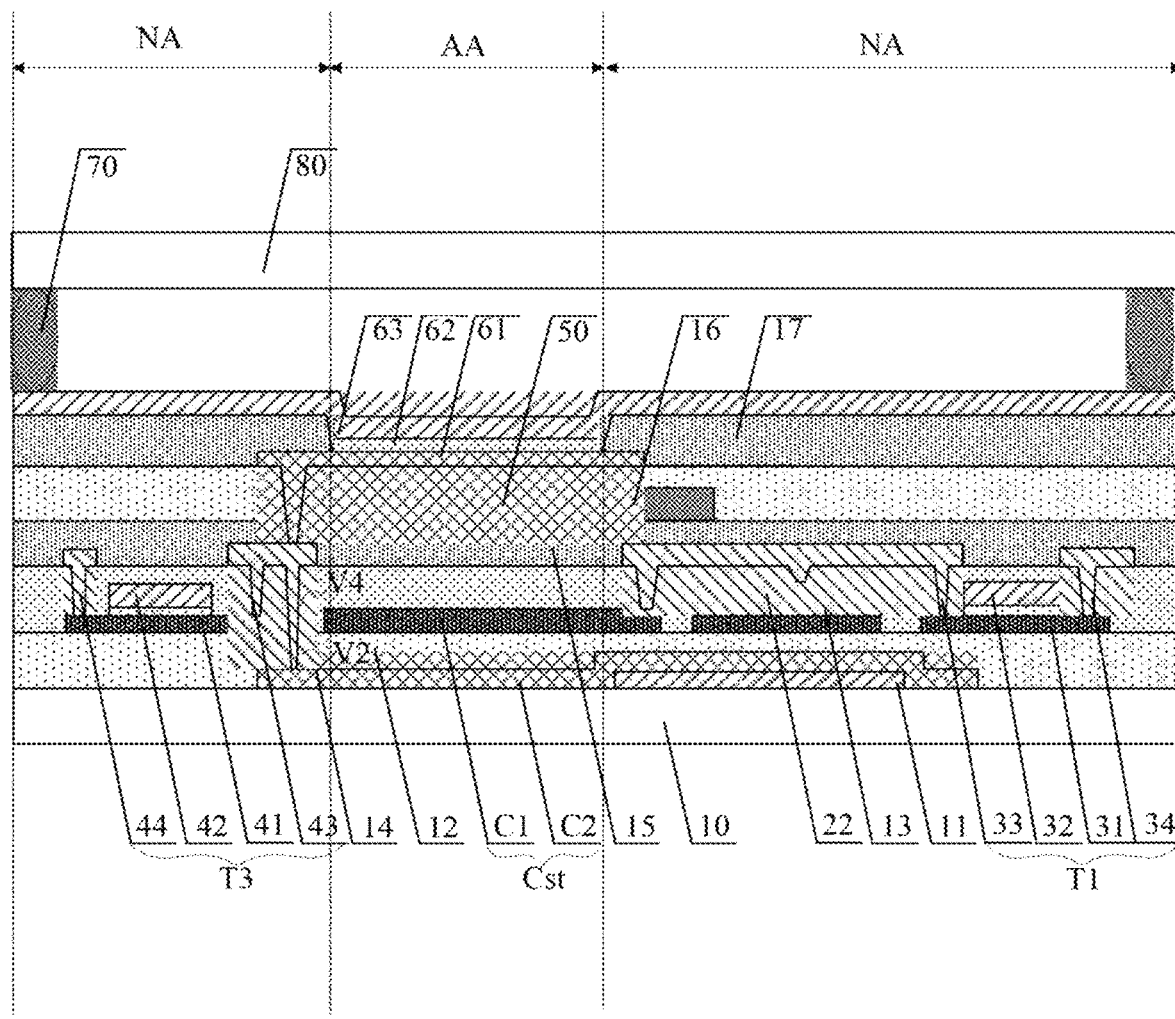
FIG. 2A is a cross-sectional view of a display substrate according to an embodiment of the present disclosure.
Figure 2B:
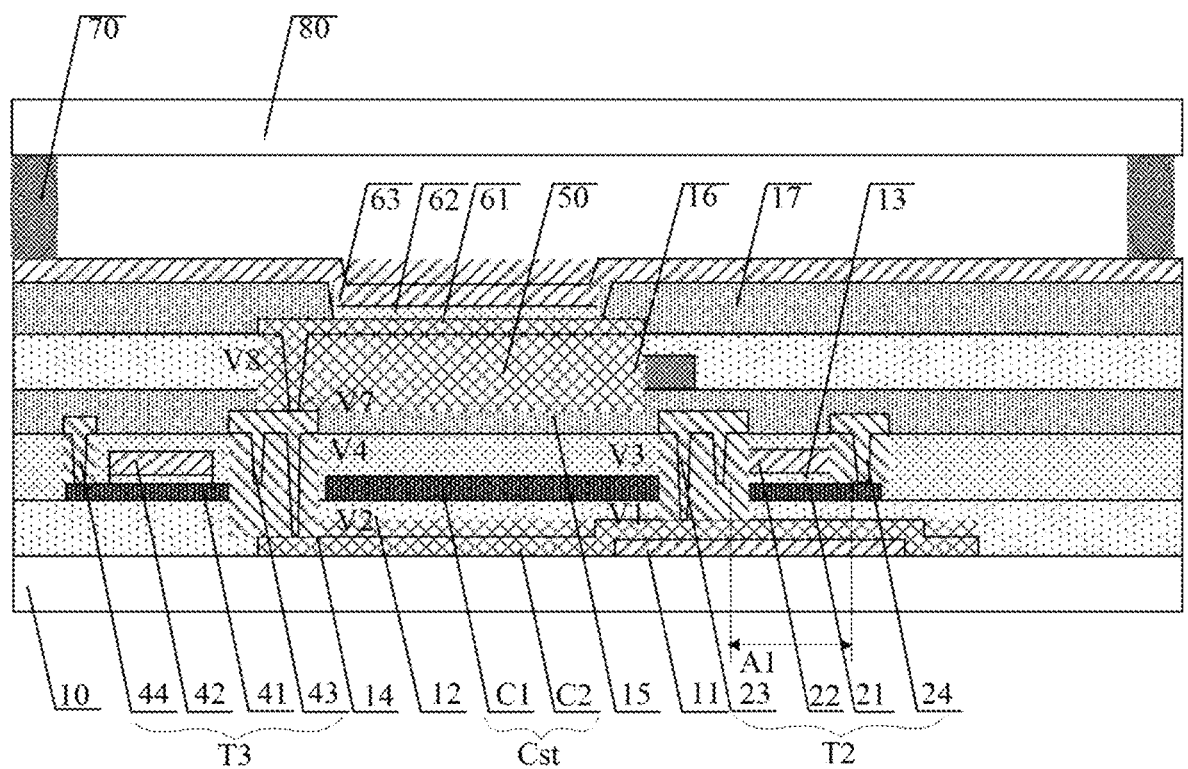
FIG. 2B is another cross-sectional view of a display substrate according to an embodiment of the present disclosure.
Figure 3:
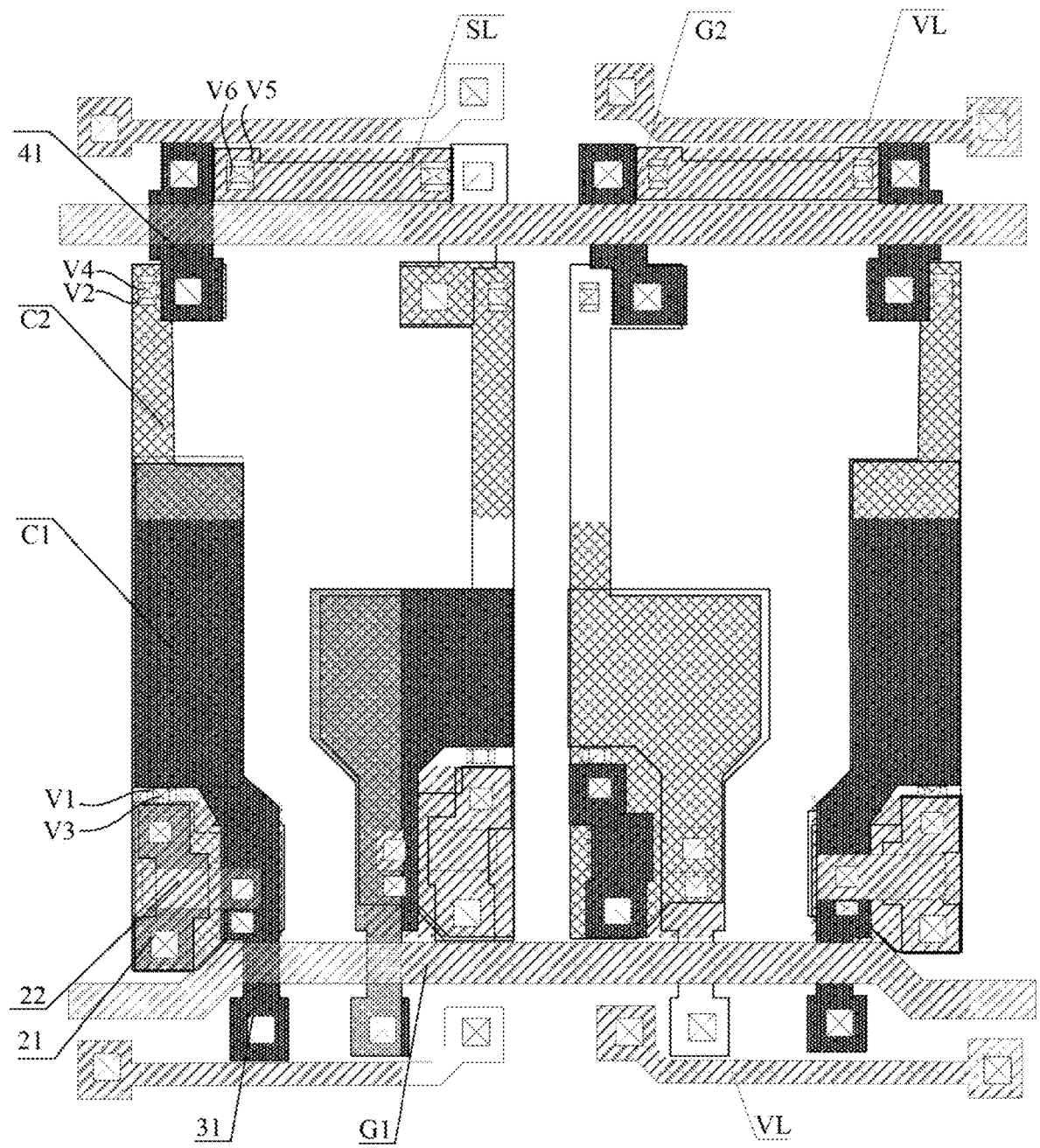
FIG. 3 is a top view of a display substrate according to an embodiment of the present disclosure.

An embodiment of the present disclosure provides a display substrate. FIG. 2A is a cross-sectional view of a display substrate according to an embodiment of the present disclosure. FIG. 2A is another cross-sectional view of a display substrate according to an embodiment of the present disclosure. FIG. 3 is a top view of a display substrate according to an embodiment of the present disclosure. As shown in FIGS. 2A to 2B and FIG. 3, an embodiment of the present disclosure provides a display substrate, including a base substrate 10 and multiple sub-pixels disposed on the base substrate 10, wherein each sub-pixel includes a light-emitting region AA and a non-light-emitting region NA, and a drive circuit is disposed in each sub-pixel. The drive circuit includes a storage capacitor Cst and multiple transistors, wherein the multiple transistors include a switch transistor T1, a drive transistor T2 and a sense transistor T3.

For each sub-pixel, the multiple transistors are located in the non-light-emitting region NA, the storage capacitor Cst is a transparent capacitor, and there is an overlapping region between an orthographic projection of the storage capacitor Cst on the base substrate 10 and the light-emitting region AA. A first electrode C1 of the storage capacitor Cst is disposed on a same layer as an active layer of the multiple transistors, but on a different layer from the source and drain electrodes of the multiple transistors. A second electrode C2 of the storage capacitor Cst is located on a side of the first electrode C1 close to the base substrate 10. A first electrode 23 of the drive transistor T2 is in direct contact with the second electrode C2 to achieve an electrical connection, and a first electrode 43 of the sense transistor T3 is in direct contact with the second electrode C2 to achieve an electrical connection. According to the following description, it can be known that the first electrode 23 of the drive transistor T2 may be in direct contact with the second electrode C2 to form an electrical connection, or the first electrode 23 of the drive transistor T2 may be in electrical connection with the second electrode C2 through a light shield layer 11, depending on the connection relation between the light shield layer 11 and the second electrode C2. When the light shield layer 11 is disposed on a side of the second electrode C2 close to the base substrate 10, the first electrode 23 of the drive transistor T2 is in direct contact with the second electrode C2 to form an electrical connection. When the second electrode C2 is disposed on a side of the light shield layer 11 close to the base substrate 10, the first electrode 23 of the drive transistor T2 is in direct contact with the second electrode C2 to form an electrical connection through the light shield layer. The first electrode 43 of the sense transistor T3 is the same as the second electrode C2, and will not be further elaborated herein.

In an exemplary embodiment, the sub-pixels on the base substrate are disposed in an array. It should be noted that in FIGS. 2A to 2B and FIG. 3 one sub-pixel is taken as an example, and FIGS. 2A and 2B are cross-sectional views from different angles.

In an exemplary embodiment, the base substrate 10 may be a rigid substrate or a flexible substrate, wherein the rigid substrate may be, but is not limited to, one or more of glass and metal foils; and the flexible substrate may be, but is not limited to, one or more of polyethylene glycol terephthalate, ethylene terephthalate, polyether ether ketone, polystyrene, polycarbonate, polyarylate, polyarylester, polyimide, polyvinyl chloride, polyethylene, and textile fibers.

In an exemplary embodiment, as shown in FIGS. 2A to 2B and 3, the switch transistor T1 in the embodiment of the present disclosure includes an active layer 31, a gate electrode 32, a first electrode 33 and a second electrode 34 which are disposed on a base substrate. The drive transistor T2 includes an active layer 21, a gate electrode 22, a first electrode 23 and a second electrode 24 which are disposed on the base substrate. The sense transistor T3 includes an active layer 41, a gate electrode 42, a first electrode 43, and a second electrode 44 which are disposed on the base substrate.

In an exemplary embodiment, the display substrate according to the embodiment of the present disclosure is a bottom emission type of OLED display substrate.

The storage capacitor in the embodiment of the disclosure is a transparent capacitor, which does not affect the light-emitting effect of the display substrate and can ensure smooth light-emitting.

In an exemplary embodiment, each sub-pixel is further provided with a light-emitting element, which may be an OLED.

The embodiments of the present disclosure provide a display substrate, including a base substrate and multiple sub-pixels disposed on the base substrate, wherein each sub-pixel includes a light-emitting region and a non-light-emitting region, and each sub-pixel is provided with a drive circuit; the drive circuit includes a storage capacitor and multiple transistors; the multiple transistors include a switch transistor, a drive transistor and a sense transistor. For each sub-pixel, the multiple transistors are located in the non-light-emitting region, the storage capacitor is a transparent capacitor, and there is an overlapping region between the orthographic projection of the storage capacitor on the base substrate and the light-emitting region. A first electrode of the storage capacitor is disposed in a same layer as an active layer of the multiple transistors and in a different layer from the source and drain electrodes of the multiple transistors, and a second electrode of the storage capacitor is located on a side of the first electrode close to the base substrate. A first electrode of the drive transistor is in direct contact with the second electrode, and a first electrode of the sense transistor is in direct contact with the second electrode. The present disclosure can greatly reduce an area ratio of the storage capacitor in the non-emitting region while ensuring an aperture ration by providing an overlapping region between the orthographic projection of the transparent storage capacitor on the base substrate and the light-emitting region, so that the area occupied by each sub-pixel can be reduced and a high PPI of the display substrate can be achieved.

In an exemplary embodiment, as shown in FIGS. 2A to 2B and FIG. 3, for each transistor, there is an overlapping region between an orthographic projection of the active layer of the transistor on the substrate and an orthographic projection of the gate electrode of the transistor on the substrate.

In an exemplary embodiment, as shown in FIGS. 2A to 2B, a display substrate according to an embodiment of the present disclosure further includes a light shield layer 11 and a buffer layer 12 disposed on a side of the active layer of the transistor close to the base substrate 10, and the light shield layer 11 and the second electrode C2 are disposed on a side of the buffer layer 12 close to the base substrate 10.

In an exemplary embodiment, an orthographic projection of the second electrode C2 on the base substrate 10 covers an orthographic projection of the light shield layer 11 on the base substrate 10, and a surface of the light shield layer 11 close to the second electrode C2 is completely in contact with the second electrode C2.

In an exemplary embodiment, the light shield layer 11 is disposed on the side of the second electrode C2 close to the base substrate 10, or the second electrode C2 is disposed on the side of the light shield layer 11 close to the base substrate 10, wherein FIGS. 2A to 2B and FIG. 3 all take the light shield layer 11 disposed on the side of the second electrode C2 close to the base substrate 10 as an example.

When the second electrode C2 is disposed on the side of the light shield layer 11 close to the base substrate 10, the first electrode 23 of the drive transistor T2 is electrically connected to the second electrode C2 through the conductive light shield layer 11, and the first electrode 43 of the sense transistor T3 is electrically connected to the second electrode C2 through the light shield layer 11.

In an embodiment of the present disclosure, the surface of the light shield layer 11 close to the second electrode C2 is in complete contact with the second electrode C2, avoiding arrangement of an insulating layer between the light shield layer and the second electrode, which not only reduces the number of layers and the thickness of the display substrate, but also reduces the number of use of masks, simplifies the preparation process and reduces manufacturing costs of the display substrate.

In an exemplary embodiment, the orthographic projection of the light shield layer 11 on the base substrate 10 covers an orthographic projection of a channel region A1 of the active layer 21 of the drive transistor T2 on the base substrate 10.

In an exemplary embodiment, the light shield layer 11 is made of metal, such as silver, aluminum and the like, which is not limited by the embodiments of the disclosure.

In an exemplary embodiment, as shown in FIGS. 2A to 2B, a display substrate according to an embodiment of the present disclosure further includes an interlayer insulating layer 14 disposed between the source and drain electrodes of the transistor and an active layer of the transistor.

In an exemplary embodiment, as shown in FIGS. 2A to 2B and FIG. 3, the buffer layer 12 in the display substrate according to the embodiment of the present disclosure includes a first via hole V1 and a second via hole V2 which expose the second electrode, and the interlayer insulating layer 14 includes a third via hole V3 exposing the first via hole V1 and a fourth via hole V4 exposing the second via hole V2.

In an exemplary embodiment, the first electrode 23 of the drive transistor T2 is connected to the second electrode C2 through the first via hole V1 and the third via hole V3, and the first electrode 43 of the sense transistor T3 is connected to the second electrode C2 through the second via hole V2 and the fourth via hole V4.

In an exemplary embodiment, as shown in FIGS. 2A to 2B and FIG. 3, the interlayer insulating layer 14 is further provided with via holes exposing the active layers of the multiple transistors, and the source and drain electrodes of the multiple transistors are connected to the active layers through the via holes.

Figure 4:
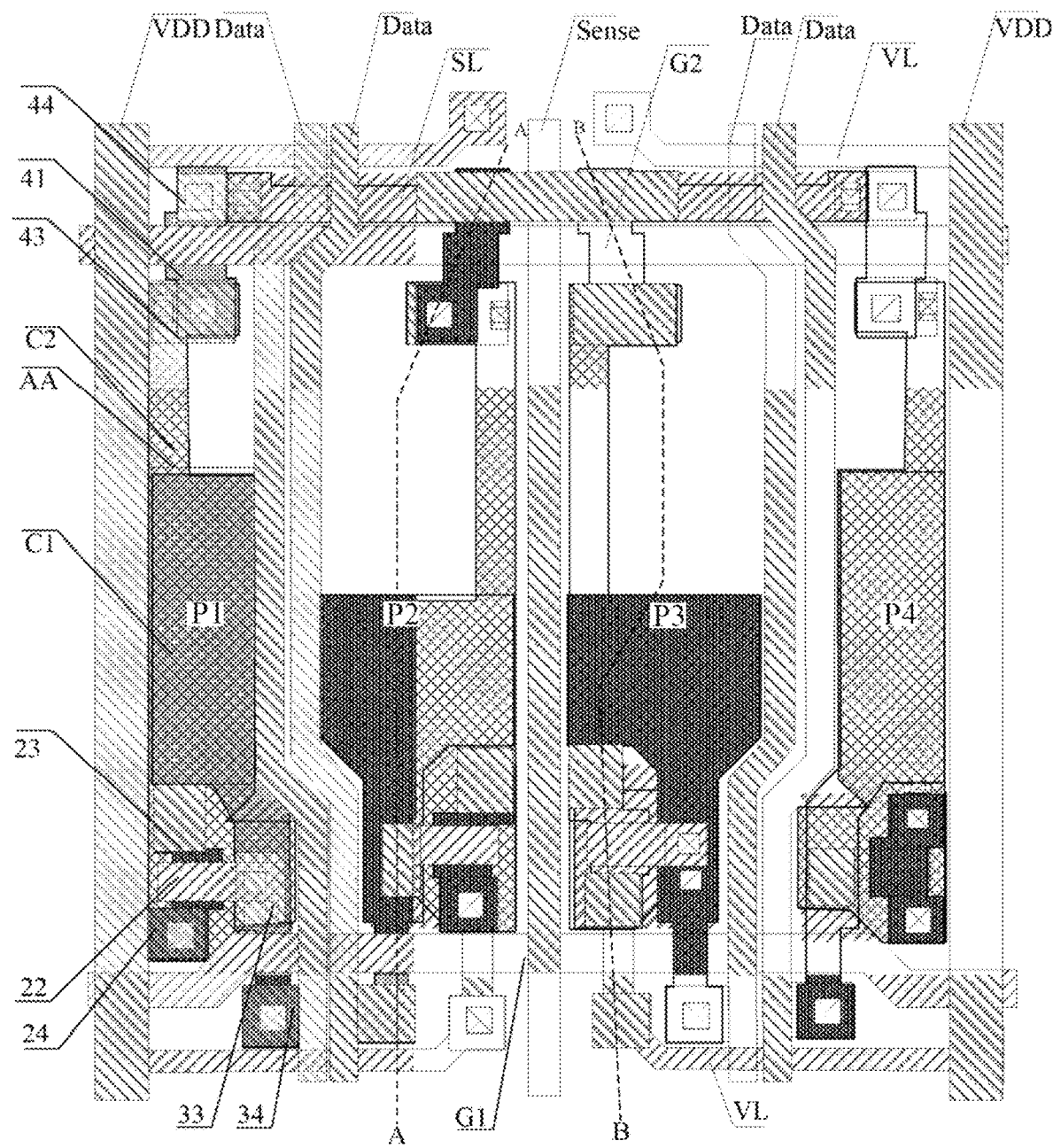
FIG. 4 is another top view of a display substrate according to an embodiment of the present disclosure.

In another exemplary embodiment, FIG. 4 is another top view of a display substrate according to an embodiment of the present disclosure. As shown in FIG. 4, the display substrate according to the embodiment of the present disclosure further includes multiple rows of gate lines and multiple columns of data lines disposed on the base substrate, wherein each sub-pixel is defined by intersection of gate lines and data lines, and the gate lines includes a first gate line G1 and a second gate line G2. FIG. 4 takes four sub-pixels as an example.

FIG. 2A is a cross-sectional view of FIG. 4 along A-A direction, and FIG. 2B is a cross-sectional view of FIG. 4 along B-B direction.

In an exemplary embodiment, a first gate line G1 and a second gate line G2 are disposed in a same layer as the gate electrodes of the transistors and the data lines Data are disposed in a same layer as the source and drain electrodes of the transistors.

In an exemplary embodiment, for each sub-pixel, the first electrode C1 is respectively connected to the first electrode 33 of the switch transistor T1 and the gate electrode 22 of the drive transistor T2. The second electrode C2 is respectively connected to the first electrode 23 of the drive transistor T2 and the first electrode 43 of the sense transistor T3. The gate electrode of the switch transistor T1 is connected to the first gate line G1 among the gate lines corresponding to the sub-pixel. The second electrode 34 of the switch transistor T1 is connected to the data line Data corresponding to the sub-pixel, and the gate electrode of the sense transistor T3 is connected to the second gate line G2 among the gate lines corresponding to the sub-pixel.

In an exemplary embodiment, as shown in FIG. 4, for each sub-pixel, the light-emitting region AA includes a first side and a second side which are oppositely disposed along an extending direction of the data line Data.

In an exemplary embodiment, it can be seen from FIGS. 2A to 2B that the sense transistor T3 and the second gate line G2 are both located on the first side of the light-emitting region AA, and the switch transistor T1, the drive transistor T2 and the first gate line G1 are all located on the second side of the light-emitting region AA.

In an exemplary embodiment, as shown in FIG. 4, the display substrate further includes power supply lines VDD and a sensing line Sense which are disposed in a same layer as the data lines Data. Each pixel includes four sub-pixels disposed along an extending direction of the gate line, and each pixel corresponds to two columns of power supply lines and one column of sensing line.

In an exemplary embodiment, the pixel structures of a second sub-pixel and a third sub-pixel are symmetrically disposed, and a first sub-pixel and a fourth sub-pixel are symmetrically disposed.

For each pixel, the sensing line Sense corresponding to the pixel is located between the second sub-pixel P2 and the third sub-pixel P3, one column of power supply line VDD corresponding to the pixel is located on a side of the first sub-pixel P1 away from the second sub-pixel P2, and another column of power supply line VDD corresponding to the pixel is located on a side of the fourth sub-pixel P4 away from the third sub-pixel P3.

A data line Data corresponding to the first sub-pixel P1 is located on a side of the first sub-pixel P1 close to the second sub-pixel P2. A data line corresponding to the second sub-pixel P2 is located on a side of the second sub-pixel P2 close to the first sub-pixel P1. A data line corresponding to the third sub-pixel P3 is located on a side of the third sub-pixel P3 close to the fourth sub-pixel P4. A data line corresponding to the fourth sub-pixel P4 is located on a side of the fourth sub-pixel P4 close to the third sub-pixel P3.

In an exemplary embodiment, as shown in FIG. 4, the display substrate according to an embodiment of the present disclosure further includes: power connection lines VL disposed in a same layer as the gate electrodes of the transistors and sensing connection lines SL disposed in a same layer as the light shield layer 11. Each pixel corresponds to two power connection lines disposed along the extending direction of the gate lines and two sensing connection lines SL disposed along the extending direction of the gate lines. The power connection lines VL respectively correspond to the power supply lines VDD, and each power connection line is connected to a corresponding power supply line. The two sensing connection lines SL are connected to the sensing lines Sense.

In an exemplary embodiment, a second electrode of the drive transistor of the second sub-pixel P2 is connected to one power connection line VL, and a second electrode of the drive transistor of the third sub-pixel P3 is connected to another power connection line VL. A second electrode of the sense transistor of the first sub-pixel P1 is connected to one sensing connection line SL, and a second electrode of the sense transistor of the fourth sub-pixel P4 is connected to another sensing connection line SL.

In an exemplary embodiment, the sensing connection lines SL may have a single-layer structure or a double-layer structure. When a sensing connection line SL has a single-layer structure, it is disposed in a same layer as the light shield layer or the second electrode, and when the sensing connection line SL has a double-layer structure, the first layer and the light shield layer of the sensing connection line are disposed in a same layer, while the second layer and the second electrode are disposed in the same layer. In FIG. 4, the sensing connection lines and the light shield layer are disposed in a same layer as an example.

In an exemplary embodiment, as shown in FIGS. 2A to 2B, a display substrate according to an embodiment of the present disclosure further includes a gate insulating layer 13 disposed between a gate electrode of a transistor and an active layer of the transistor.

An orthographic projection of the gate insulating layer 13 on the base substrate 10 coincides with an orthographic projection of the gate electrode of the transistor on the base substrate 10.

In an exemplary embodiment, the buffer layer 12, the gate insulating layer 13, and the interlayer insulating layer 14 are made of silicon oxide, silicon nitride or a composite of silicon oxide and silicon nitride, which is not limited by the embodiments of the present disclosure.

In an exemplary embodiment, as shown in FIG. 3, for each sub-pixel, the buffer layer 12 is further provided with a fifth via hole V5, wherein the fifth via hole V5 exposes the sensing connection line SL. The interlayer insulating layer 14 is further provided with a sixth via hole V6 exposing the fifth via hole V5, wherein the second electrode 44 of the sense transistor T3 is connected to the sensing connection line SL through the fifth via hole V5 and the sixth via hole V6.

In an exemplary embodiment, the first electrode C1 is made of transparent metal oxide, and the transparent metal oxide includes indium gallium zinc oxide (IGZO) or the like, which is not limited by the embodiments of the disclosure.

In an exemplary embodiment, the second electrode C2 is made of a transparent conductive material, and the transparent conductive material includes indium tin oxides (ITO), zinc tin oxide or the like, which is not limited by the embodiments of the disclosure.

Figure 5:
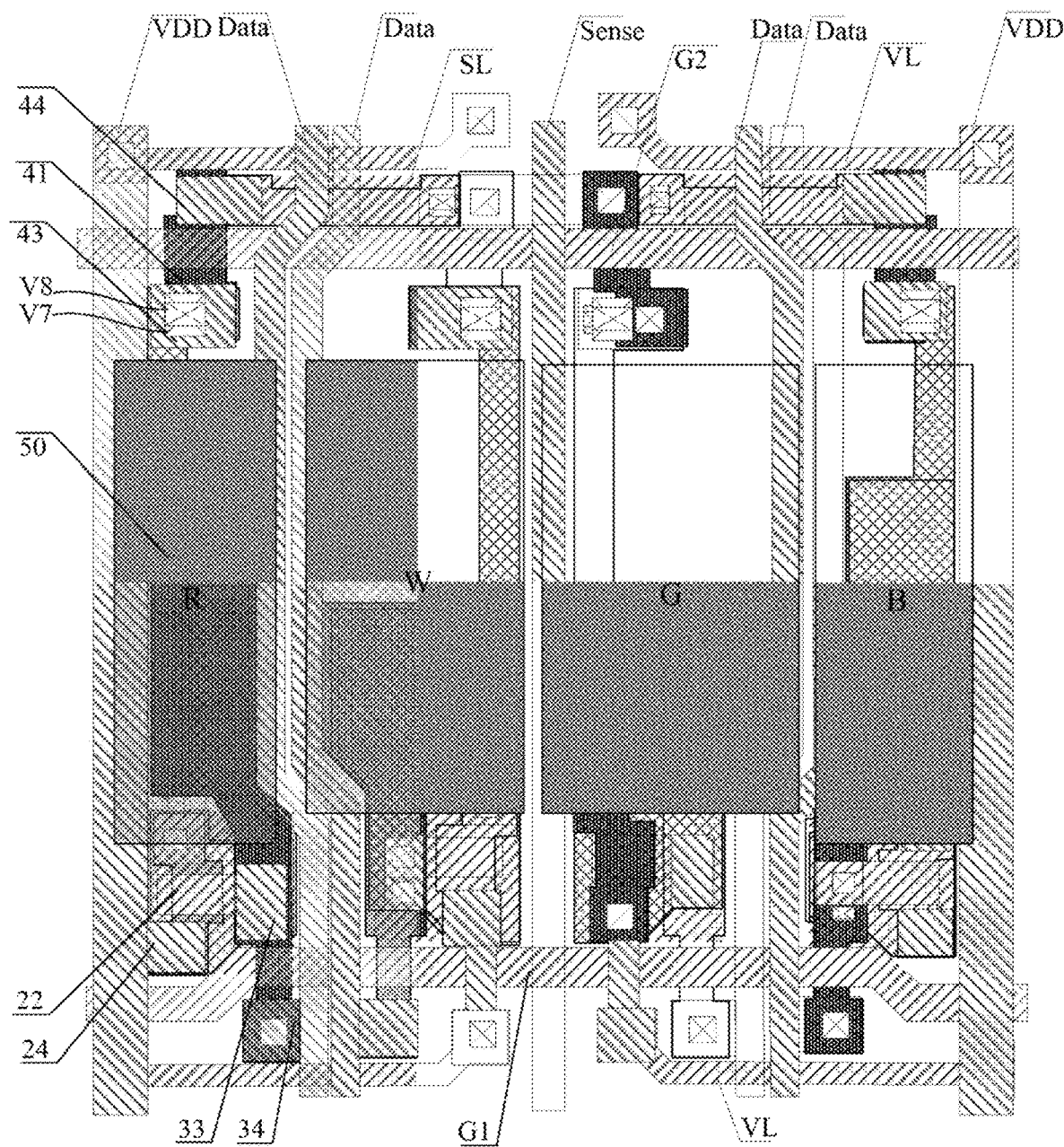
FIG. 5 is a another top view of a display substrate according to an embodiment of the present disclosure.
Figure 6:
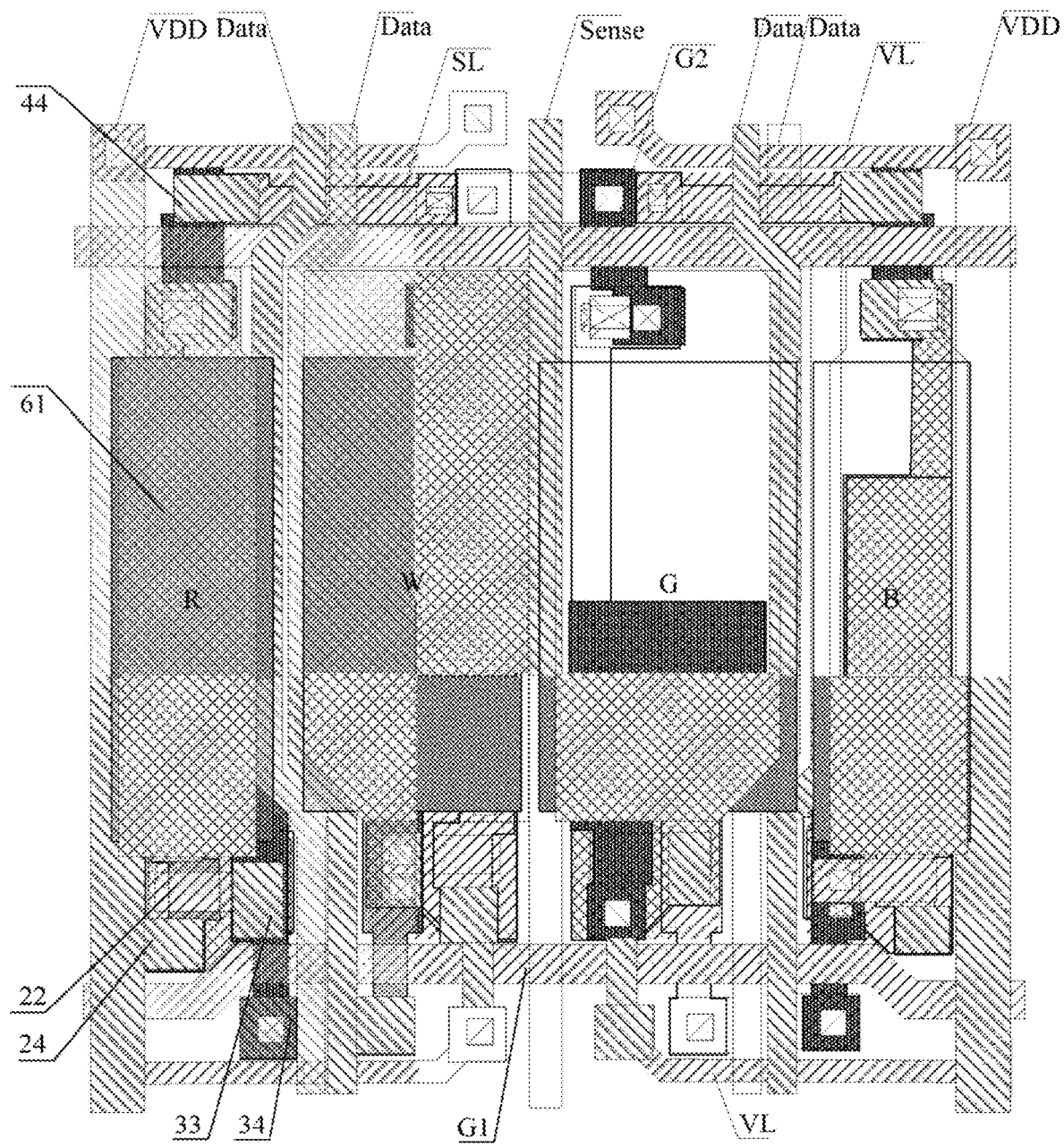
FIG. 6 is a another top view of a display substrate according to an embodiment of the present disclosure.

In another exemplary embodiment, FIG. 5 is another top view of a display substrate according to an embodiment of the present disclosure, and FIG. 6 is another top view of a display substrate according to an embodiment of the present disclosure. As shown in FIGS. 2A to 6, each sub-pixel is also provided with a light-emitting element and a filter 50 of the same color as the sub-pixel. The light-emitting element includes an anode 61, an organic light-emitting layer 62 and a cathode 63 which are sequentially disposed, wherein the anode 61 is connected to the first electrode 43 of the sense transistor T3, the anode 61 is a transmission electrode and the cathode 63 is a reflection electrode.

In an exemplary embodiment, the anode 61 may be made of a transparent conductive material, such as indium tin oxide ITO, zinc tin oxide or the like, which is not limited by the embodiments of the present disclosure.

In an exemplary embodiment, the cathode 63 is made of metal, such as silver, aluminum or the like, which is not limited by the embodiments of the disclosure.

In an exemplary embodiment, there is an overlapping region between an orthographic projection of the light-emitting element on the base substrate 10 and the light-emitting region AA, and the filter 50 is located in the light-emitting region AA and disposed on a side of the light-emitting element close to the base substrate 10. An orthographic projection of the anode 61 on the base substrate 10 covers an orthographic projection of the filter 50 on the base substrate 10.

In an exemplary embodiment, as shown in FIGS. 2A to 2B, a display substrate according to an embodiment of the present disclosure further includes a passivation layer 15 disposed on a side of the source and drain electrodes of the transistor away from the base substrate 10, a planarization layer 16 disposed between the anode 61 and the filter 50, and a pixel defining layer 17 for defining a sub-pixel region, wherein the pixel defining layer 17 is disposed on a side of the planarization layer 16 away from the base substrate 10.

In an exemplary embodiment, with reference to FIGS. 2A to 2B and 5, the passivation layer 15 is disposed on a side of the filter 50 close to the base substrate 10, and the planarization layer 16 is disposed between the light-emitting element and the filter 50. The passivation layer 15 is provided with a seventh via hole V7 exposing the first electrode 43 of the sense transistor T3, and the planarization layer 16 is provided with an eighth via hole V8 exposing the seventh via hole V7.

The anode 61 is connected to the first electrode 43 of the sense transistor T3 through the seventh via hole V7 and the eighth via hole V8.

An orthographic projection of the eighth via hole V8 on the base substrate 10 does not completely coincide with an orthographic projection of the fourth via hole V4 on the base substrate 10.

In an exemplary embodiment, as shown in FIGS. 2A to 2B, a display substrate according to an embodiment of the present disclosure further includes a supporting part 70 disposed on a side of the light-emitting element away from the base substrate 10 and includes a cover plate 80 disposed on a side of the supporting part 70 away from the base substrate 10.

In an exemplary embodiment, the cover plate 80 is configured to protect the light-emitting element. The cover plate 80 may be a glass cover plate.

Figure 7:
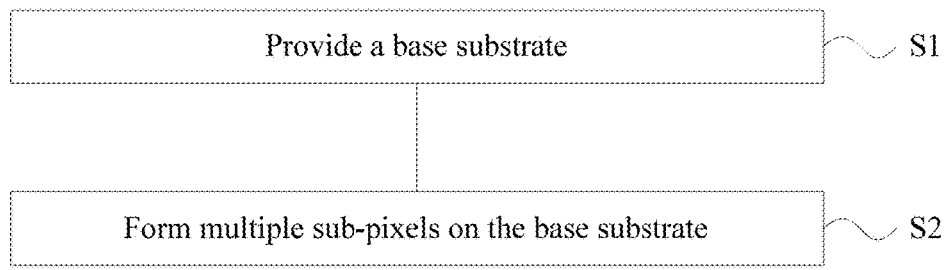
FIG. 7 is a flowchart of a method for preparing a display substrate according to an embodiment of the present disclosure.

Based on the same inventive concept, some embodiments of the present disclosure further provide a method for preparing a display substrate. FIG. 7 is a flowchart of a method for preparing a display substrate according to an embodiment of the present disclosure. As shown in FIG. 7, the method for preparing a display substrate according to an embodiment of the present disclosure includes the following steps:

Step S1, providing a base substrate.

In an exemplary embodiment, the base substrate may be a rigid substrate or a flexible substrate, wherein the rigid substrate may be, but is not limited to, one or more of glass and metal foils; and the flexible substrate may be, but is not limited to, one or more of polyethylene glycol terephthalate, ethylene terephthalate, polyether ether ketone, polystyrene, polycarbonate, polyarylate, polyarylester, polyimide, polyvinyl chloride, polyethylene, and textile fibers.

Step S2, forming multiple sub-pixels on the base substrate.

In an exemplary embodiment, the sub-pixels are disposed on the base substrate in an array. FIGS. 2A to 2B take one sub-pixel as an example.

In an exemplary embodiment, each sub-pixel includes a light-emitting region and a non-light-emitting region, and each sub-pixel is provided therein with a drive circuit. The drive circuit includes a storage capacitor and multiple transistors, wherein the multiple transistors include a switch transistor, a drive transistor and a sense transistor.

For each sub-pixel, the multiple transistors are located in the non-light-emitting region, the storage capacitor is a transparent capacitor, and there is an overlapping region between an orthographic projection of the storage capacitor on the base substrate and the light-emitting region. A first electrode of the storage capacitor is disposed in a same layer as an active layer of the multiple transistors, and a second electrode of the storage capacitor is located on a side of the first electrode close to the base substrate.

A first electrode of the drive transistor is in direct contact with the second electrode, and a first electrode of the sense transistor is in direct contact with the second electrode.

The display substrate is a display substrate provided in the preceding embodiments, and has a similar implementation principle and implementation effects, which will not be described further here.

In an exemplary embodiment, the display substrate further includes gate lines, data lines, power supply lines and sensing lines, wherein the gate lines includes a first gate line and a second gate line. Step S2 specifically includes:

forming a light shield layer and a second electrode on the base substrate; forming a first electrode and active layers of multiple transistors on the light shield layer and the second electrode; forming gate electrodes of the multiple transistors, first gate line and second gate line on the first electrode and the active layers of the multiple transistors; forming data lines, power supply lines, sensing lines and source and drain electrodes of the multiple transistors on the first electrode and the active layers of the multiple transistors; and sequentially forming filters and light-emitting elements on the data lines, the power supply lines, the sensing lines and the source and drain electrodes of the multiple transistors.

In an exemplary embodiment, forming a light shield layer and a second electrode on the base substrate includes sequentially forming the light shield layer and the second electrode on the base substrate, or sequentially forming the second electrode and the light shield layer on the base substrate, or simultaneously forming the second electrode and the light shield layer on the base substrate.

In an exemplary embodiment, sequentially forming the light shield layer and the second electrode on the base substrate includes forming the light shield layer on the base substrate using a first mask and forming the second electrode on the light shield layer using a second mask.

In an exemplary embodiment, sequentially forming the second electrode and the light shield layer on the base substrate includes forming the second electrode on the base substrate by a patterning process using a second mask and forming the light shield layer on the second electrode using a first mask.

In an exemplary embodiment, simultaneously forming the second electrode and the light shield layer on the base substrate includes sequentially depositing a light shielding thin film and a transparent conductive thin film on the base substrate, and simultaneously forming the second electrode and the light shield layer by using a halftone mask.

The patterning process herein includes: photoresist coating, exposure, development, etching, and photoresist stripping, etc.

Figure 8A:
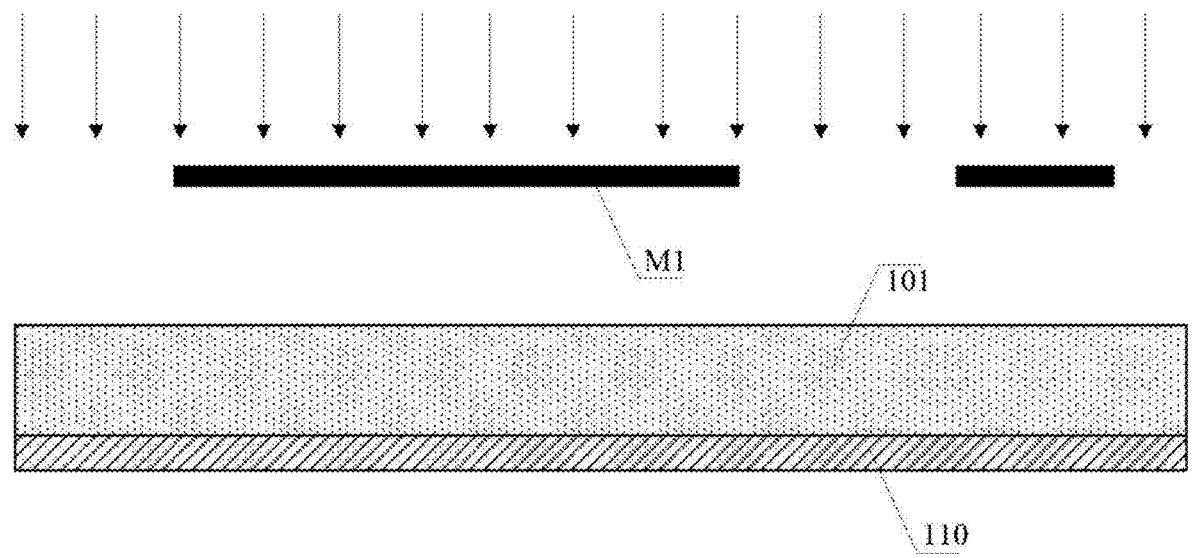
FIGS. 8A to 8H are schematic diagrams of preparation of a light shield layer and a second electrode according to an embodiment of the present disclosure.

Taking the light shield layer on the side of the second electrode close to the base substrate as an example, a preparation process of the light shield layer and the second electrode will be further explained with reference to FIGS. 8A to 8H, which includes the following steps:

Step 110, depositing a light shielding thin film 110 on the base substrate, coating a photoresist 101 on the light shielding thin film 110, and exposing the photoresist through a first mask M1, as shown in FIG. 8A.

Figure 8B:
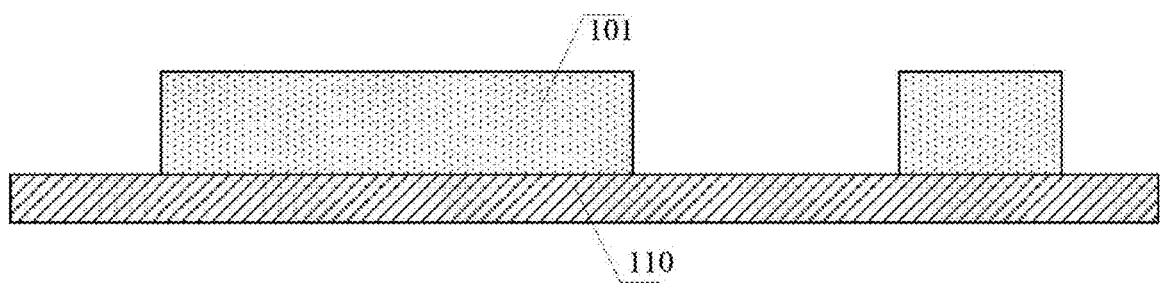

Step 120, developing the photoresist 101, as shown in FIG. 8B.

Figure 8C:
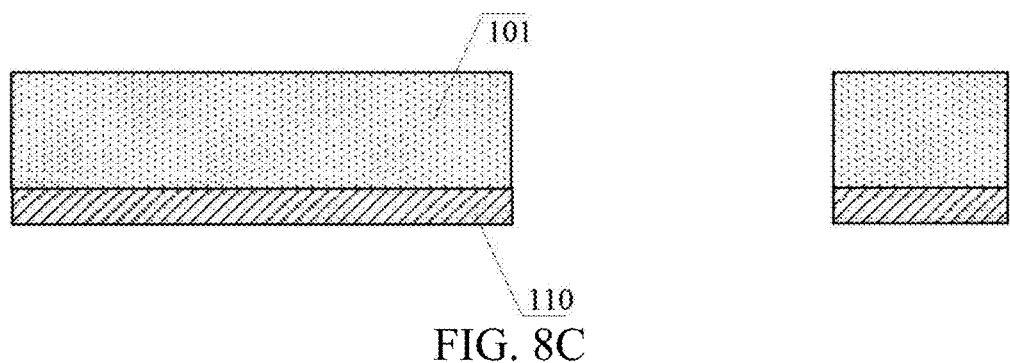

Step 130, etching off the light shielding thin film uncovered with the photoresist 101, as shown in FIG. 8C.

Figure 8D:
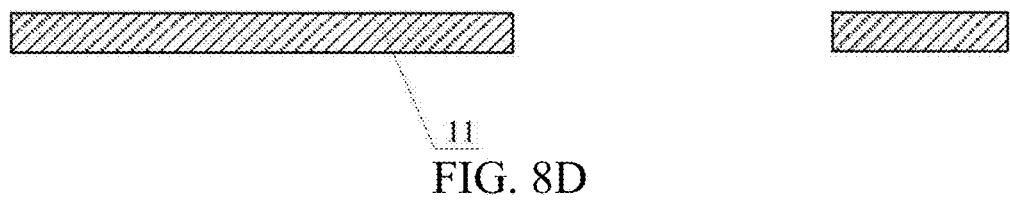

Step 140, stripping the photoresist 101 to form a light shield layer 11, as shown in FIG. 8D.

Figure 8E:
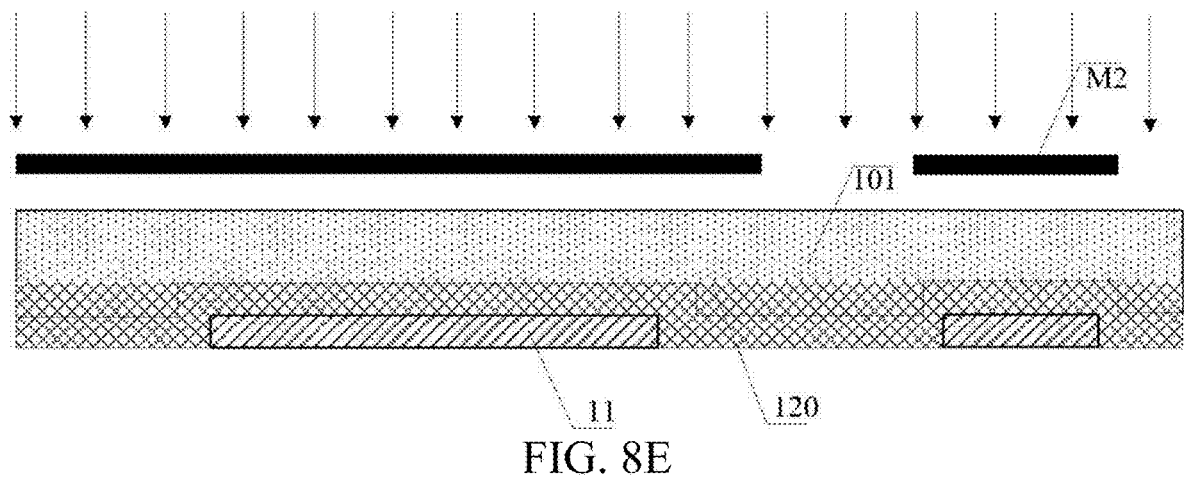

Step 150, depositing a transparent conductive thin film 120 on the light shield layer 11, coating a photoresist 101 on the transparent conductive thin film 120, and exposing the photoresist through a second mask M2, as shown in FIG. 8E.

Figure 8F:
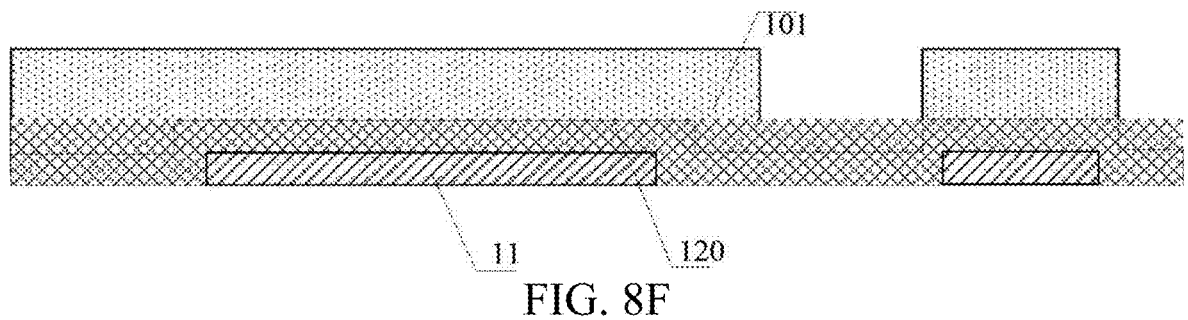

Step 160, developing the photoresist 101, as shown in FIG. 8F.

Figure 8G:
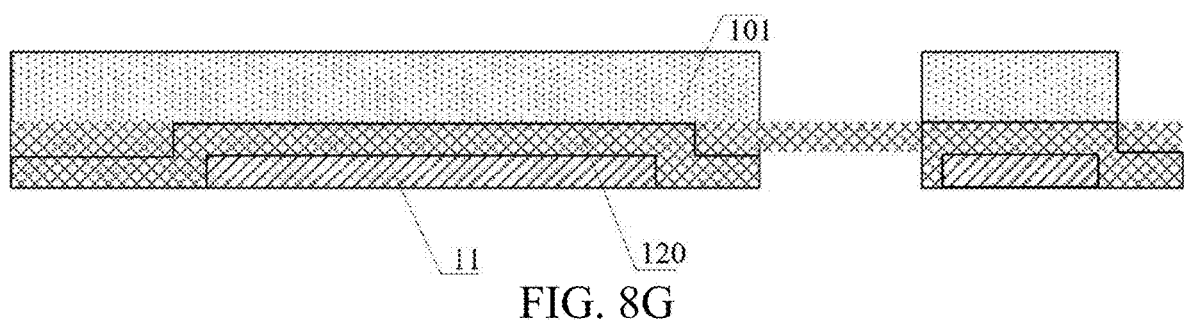

Step 170, etching off the transparent conductive thin film uncovered with the photoresist 101, as shown in FIG. 8G.

Figure 8H:
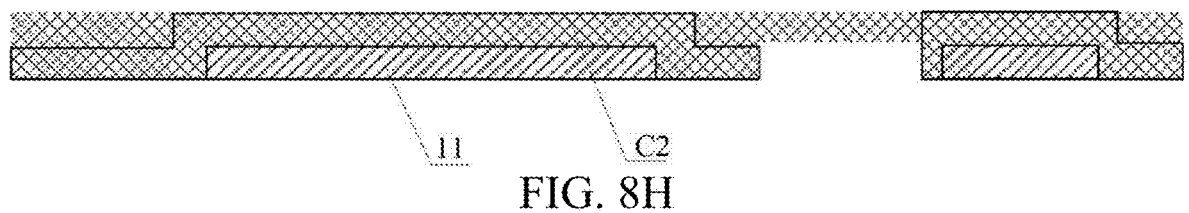

Step 180, stripping the photoresist 101 to form a second electrode C2, as shown in FIG. 8H.

In an exemplary embodiment, as one embodiment, the steps of forming a first electrode and active layers of the multiple transistors on the light shield layer and the second electrode; forming gate electrodes of the multiple transistors, first gate line and second gate line on the first electrode and the active layers of the multiple transistors; forming the data lines, the power supply lines, the sensing lines and the source and drain electrodes of the multiple transistors on the gate electrodes of the transistors, the first gate line and the second gate line include forming a buffer layer including a first via hole, a second via hole and a fifth via hole on the light shield layer and the second electrode through a patterning process; forming the first electrode and the active layers of the multiple transistors on the buffer layer by using the same process; forming the gate electrodes of the multiple transistors, the first gate line and the second gate line on the first electrode and the active layers of the multiple transistors includes forming an interlayer insulating layer including a third via hole, a fourth via hole and a sixth via hole on the gate electrodes, the first gate line and the second gate line of the transistors through a patterning process; and, forming the data lines, the power supply lines, the sensing lines and the source and drain electrodes of the multiple transistors on the interlayer insulating layer.

In an exemplary embodiment, the first and second via holes expose the second electrode, the fifth via hole exposes the sensing connection line, the third via hole exposes the first via hole, the fourth via hole exposes the second via hole, and the sixth via hole exposes the fifth via hole.

As another exemplary embodiment, the steps of forming the first electrode and the active layers of the multiple transistors on the light shield layer and the second electrode; forming the gate electrodes of the transistors, the first gate line and the second gate line on the first electrode and the active layers of the transistors; forming the data lines, the power supply lines, the sensing lines and the source and drain electrodes of the multiple transistors on the gate electrodes of the multiple transistors, the first gate line and the second gate line include forming a first insulating thin film on the light shield layer and the second electrode; forming the first electrode and the active layers of the multiple transistors on the first insulating thin film by using the same process; forming the gate electrodes of the multiple transistors, the first gate line and the second gate line on the first electrode and the active layers of the multiple transistors; forming a second insulating thin film on the gate electrodes of the transistor, the first gate line and the second gate line; and processing the first insulating thin film and the second insulating thin film through a patterning process to form a buffer layer including a first via hole, a second via hole and a fifth via hole and an interlayer insulating layer including a third via hole, a fourth via hole and a sixth via hole.

Sequentially forming filters and light-emitting elements on the data lines, the power supply lines, the sensing lines and the source and drain electrodes of the multiple transistors includes forming a passivation layer including a seventh via hole on the data lines, the power supply lines, the sensing lines and the source and drain electrodes of the multiple transistors, wherein the seventh via hole exposes the first electrode of the sense transistor; sequentially forming the filters and a planarization layer including an eighth via hole on the passivation layer, wherein the eighth via hole exposes the seventh via hole; and forming the light-emitting elements on the planarization layer.

Figure 9:
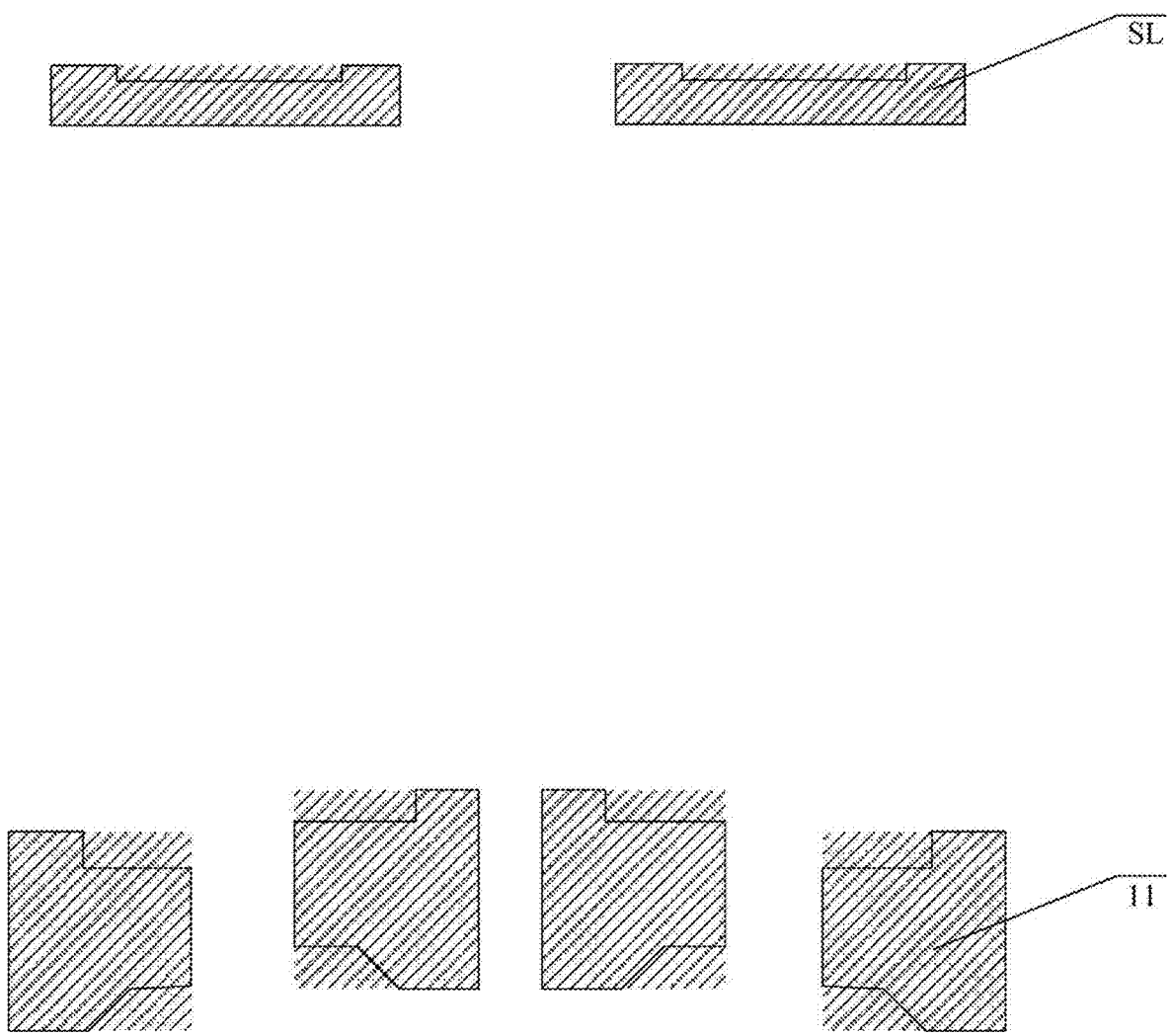
FIG. 9 is a schematic flowchart of step 100 of a method for preparing a display substrate according to an embodiment of the present disclosure.

The above embodiments can simplify the preparation processes of the display substrate. Taking an example in which there are four sub-pixels, the sensing connection lines has a single-layer structure and are disposed in a same layer as the light shield layer, and the light shield layer is disposed on the side of the second electrode close to the base substrate, the method for preparing the display substrate according to the embodiments of the present disclosure will be further explained with reference to FIGS. 9 to 15, and the method includes the following steps:

Step 100, forming a light shield layer 11 and a sensing connection line SL on a base substrate 10, as shown in FIG. 9.

Figure 10:
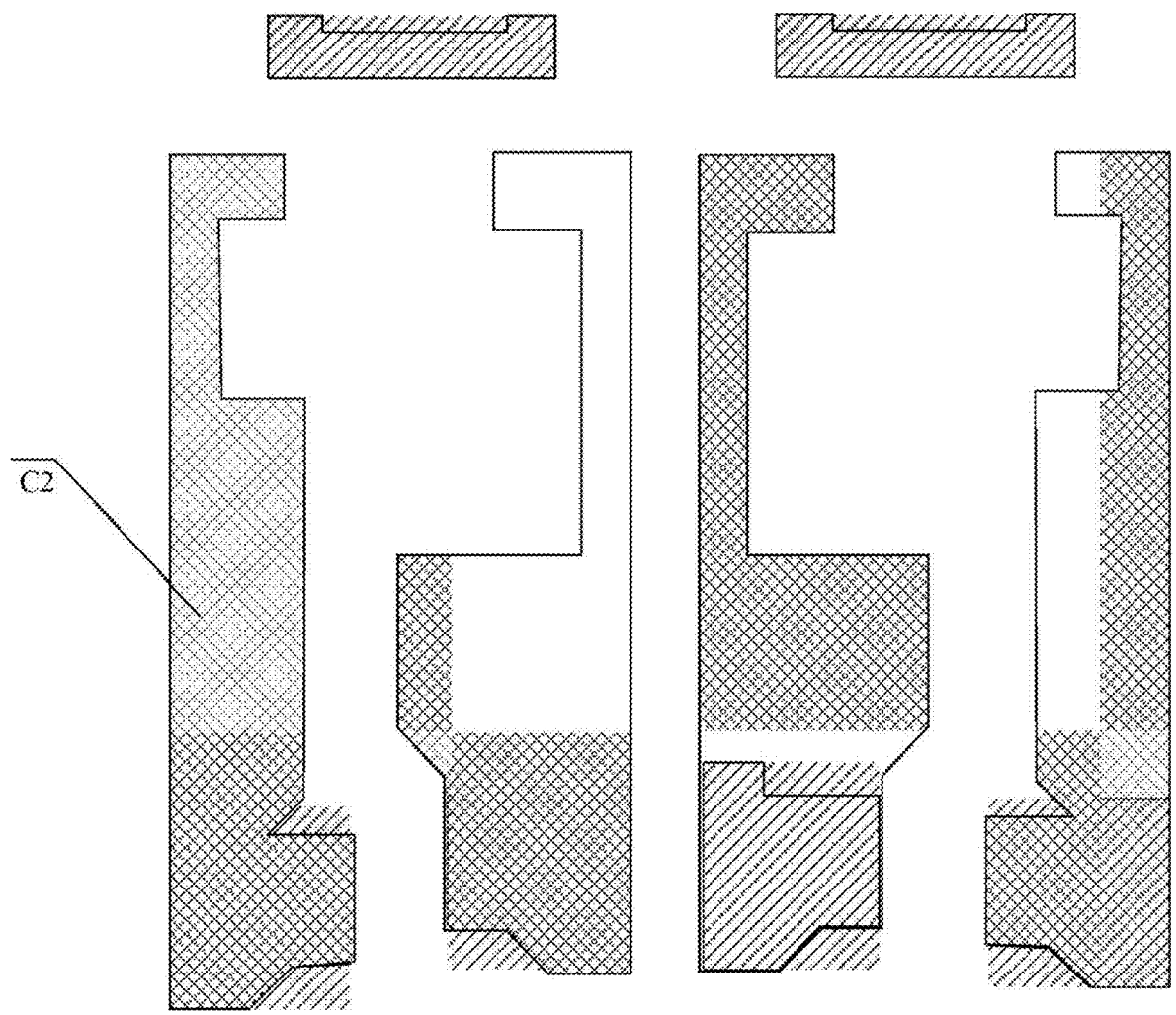
FIG. 10 is a schematic flowchart of step 200 of a method for preparing a display substrate according to an embodiment of the present disclosure.

Step 200, sequentially forming a second electrode C2 and a buffer layer (not shown in the figure) on the light shield layer and the sensing connection line, as shown in FIG. 10.

Figure 11:
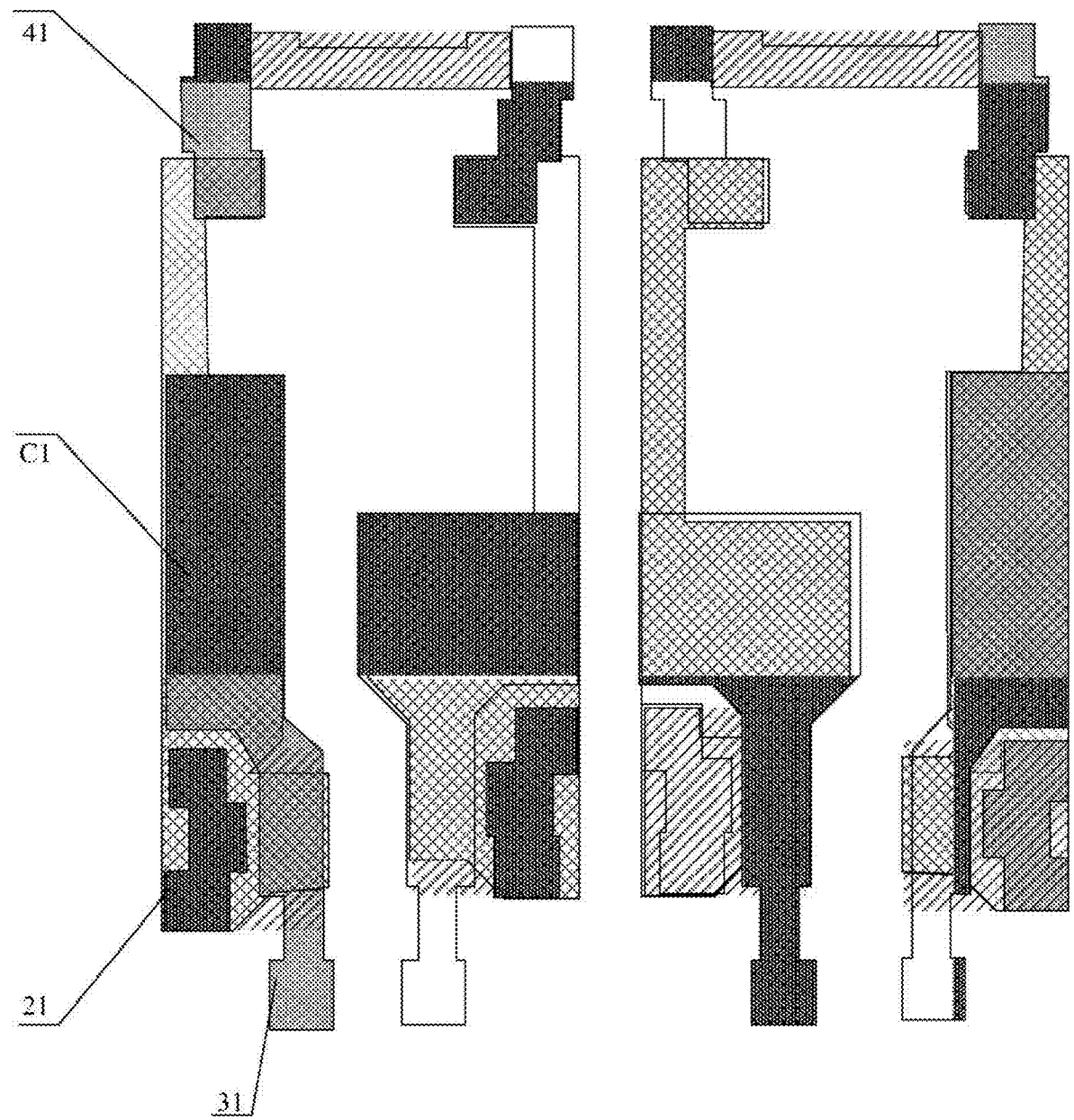
FIG. 11 is a schematic flowchart of step 300 of a method for preparing a display substrate according to an embodiment of the present disclosure.

Step 300, forming a first electrode C1, an active layer 31 of a switch transistor, an active layer 21 of a drive transistor T2 and an active layer 41 of a sense transistor on the buffer layer, as shown in FIG. 11.

Figure 12:
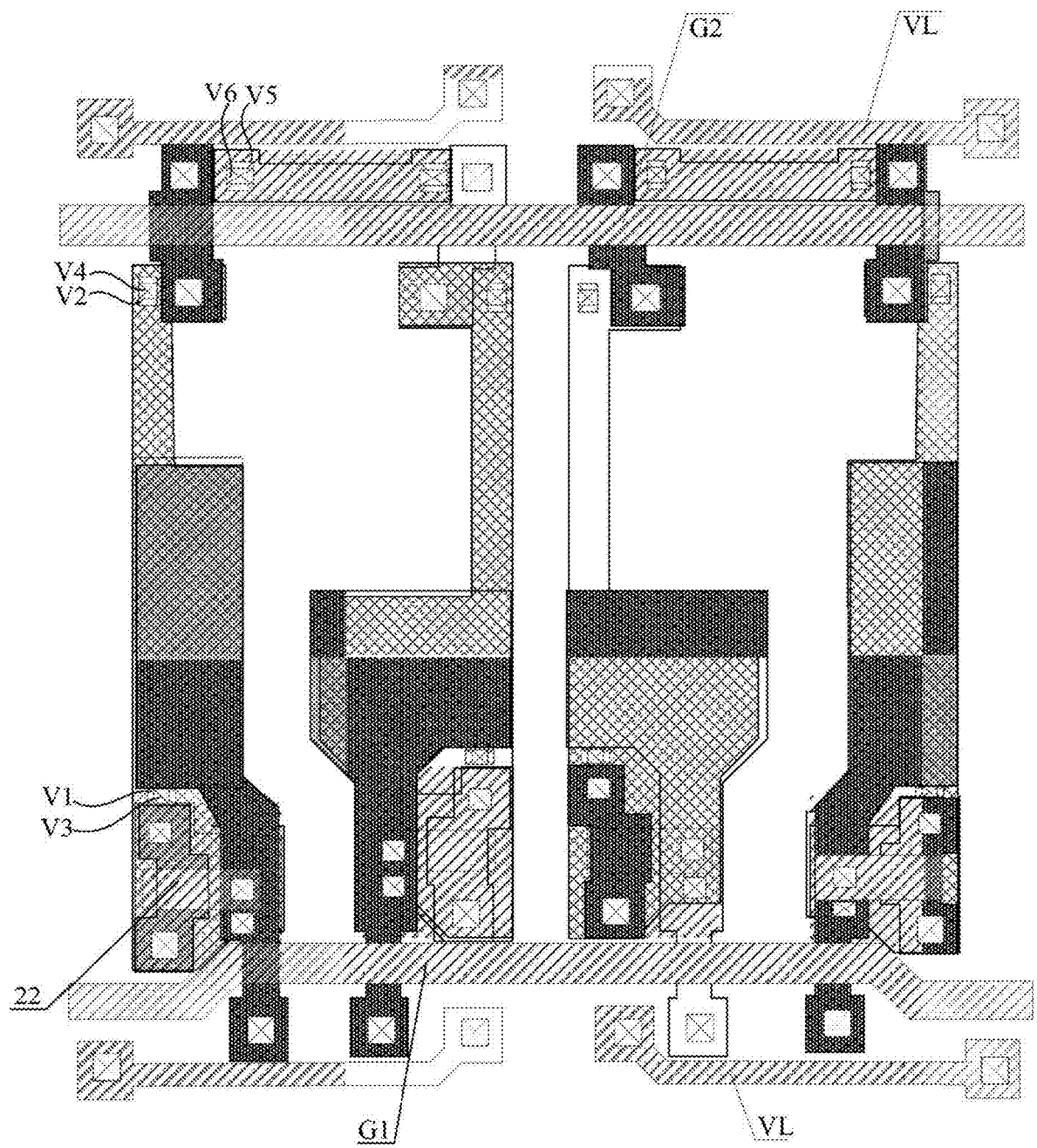
FIG. 12 is a schematic flowchart of step 400 of a method for preparing a display substrate according to an embodiment of the present disclosure.

Step 400, forming a gate insulating layer on the active layer 31 of the switch transistor, the active layer 21 of the drive transistor T2 and the active layer 41 of the sense transistor; forming a gate electrode 32 of the switch transistor, a gate electrode 22 of the drive transistor, a gate electrode 42 of the sense transistor, a first gate line G1, a second gate line G2 and a power connection line VL on the gate insulating layer; and forming an interlayer insulating layer on the gate electrodes of the transistors, the first gate line, the second gate line and the power connection line, as shown in FIG. 12.

In an exemplary embodiment, the interlayer insulating layer includes a third via hole V3, a fourth via hole V4 and a sixth via hole V6, and the buffer layer includes a first via hole V1, a second via hole V2 and a fifth via hole V5.

Figure 13:
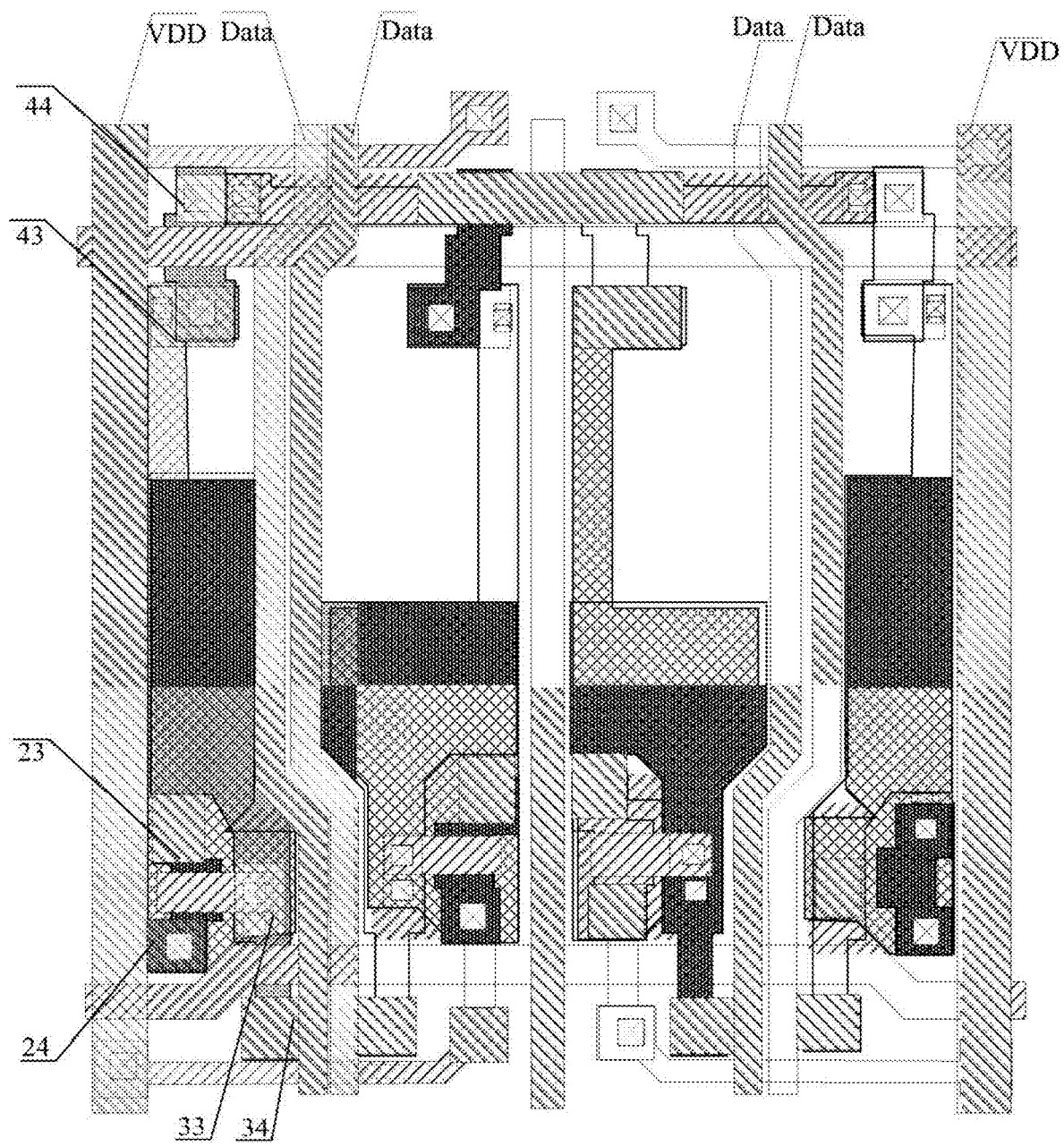
FIG. 13 is a schematic flowchart of step 500 of a method for preparing a display substrate according to an embodiment of the present disclosure.

Step 500, forming a data line Data, a power supply line VDD, a sense line Sense, a first electrode 33 of the switch transistor, a second electrode 34 of the switch transistor, a first electrode 23 of the drive transistor, a second electrode 24 of the drive transistor, a first electrode 43 of the sense transistor and a second electrode 44 of the sense transistor on the interlayer insulating layer, as shown in FIG. 13.

Figure 14:
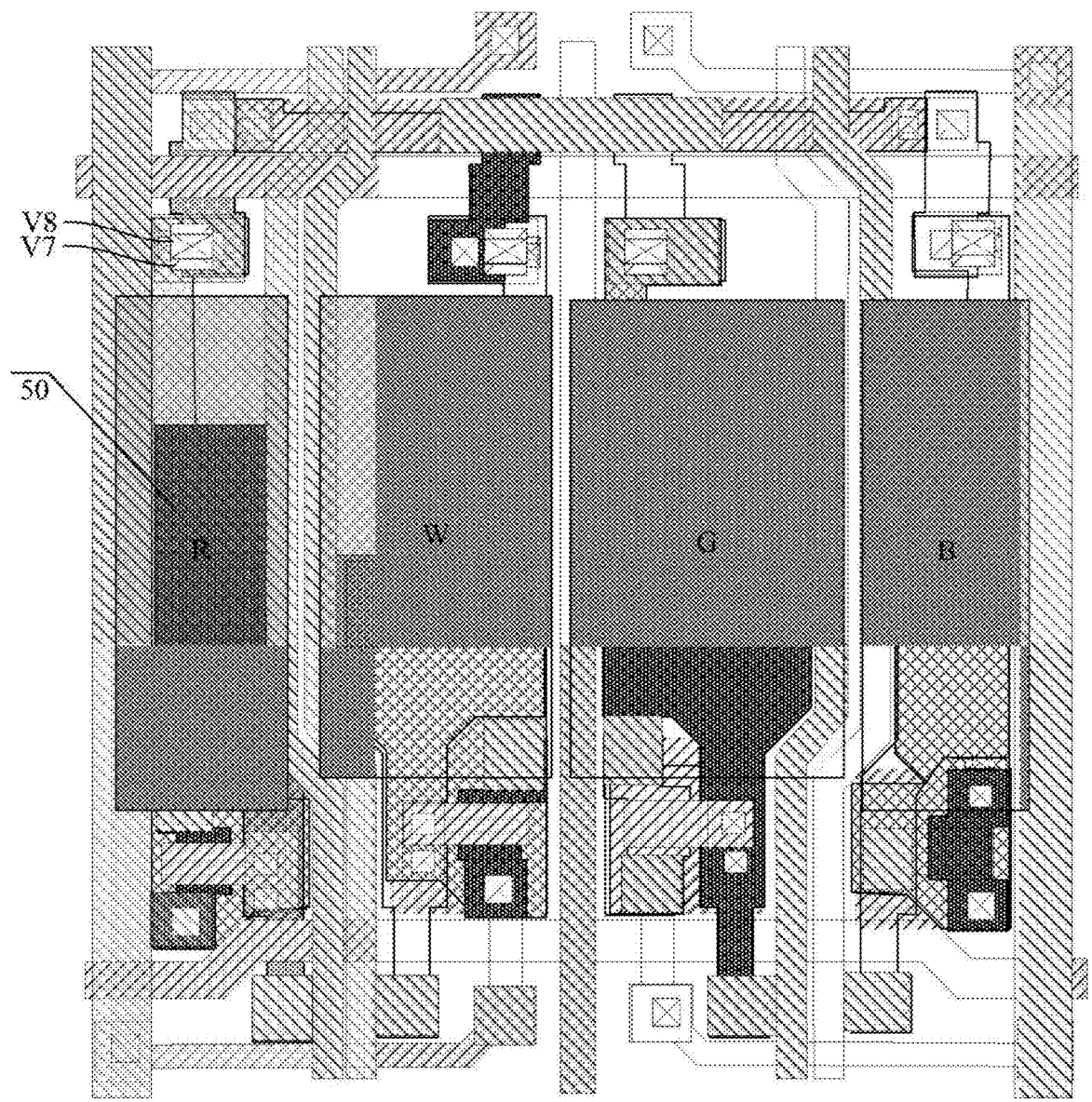
FIG. 14 is a schematic flowchart of step 600 of a method for preparing a display substrate according to an embodiment of the present disclosure.

Step 600, forming a passivation layer including a seventh via hole on the data line, the power supply line, the sensing line and the source and drain electrodes of multiple transistors; forming a filter 50 on the passivation layer; and forming a planarization layer including an eighth via hole V8 on the filter, as shown in FIG. 14.

Figure 15:
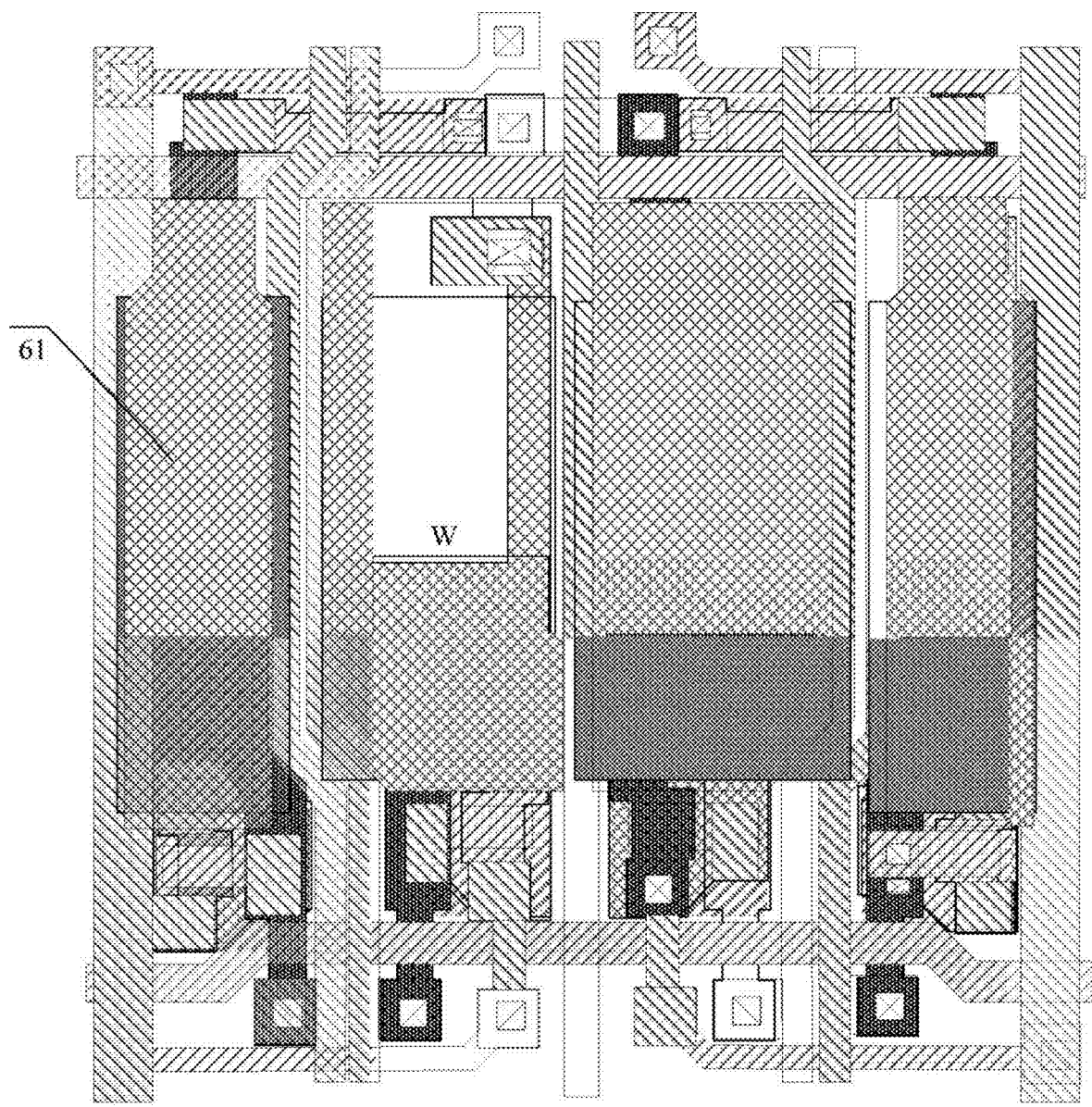
FIG. 15 is a schematic flowchart of step 700 of a method for preparing a display substrate according to an embodiment of the present disclosure.

Step 700, forming an anode 61 on the planarization layer, as shown in FIG. 15.

Step 800, sequentially forming a pixel defining layer, an organic light-emitting layer and a cathode on an anode; and sequencially forming a supporting part and a cover plate on the cathode.

Based on the same inventive concept, an embodiment of the present disclosure further provides a display apparatus, including a display substrate.

In an exemplary embodiment, the display apparatus may be any product or component with a display function such as a mobile phone, a tablet computer, a television, a display, a laptop computer, a digital photo frame, a navigator, etc. Other essential components of the display apparatus is well known to those of ordinary skills in the art, which will not be described in detail here, and should not be construed as a limitation on the present disclosure. The implementation of the display apparatus may refer to the embodiment of the display substrate described above, and the repetition will not be described in detail here.

The display substrate is the display substrate provided in any of the preceding embodiments, and has an identical or similar implementation principle and implementation effects, which will not be described further here.

The accompanying drawings of the embodiments of the present disclosure only refer to structures involved in the embodiments of the present disclosure, and other structures may refer to general designs.

For the sake of clarity, the thickness and size of layers or microstructures are exaggerated in the drawings used to describe the embodiments of the present disclosure. It may be understood that when an element such as a layer, film, region or substrate is referred to as being "on" or "under" another element, the element may be "directly" "on" or "under" the another element, or there may be an intervening element therebetween.

Although the embodiments disclosed in the present disclosure are as described above, the described contents are only the embodiments for facilitating understanding of the present disclosure, which are not intended to limit the present disclosure. A person skilled in the art to which the present disclosure pertains may make any modifications and variations in the form and details of implementation without departing from the spirit and scope of the present disclosure. Nevertheless, the scope of patent protection of the present disclosure shall still be determined by the scope defined by the appended claims.

What is claimed is:

1. A display substrate, comprising a base substrate and a plurality of sub-pixels disposed on the base substrate, wherein:
    the display substrate is a bottom emission type of organic light-emitting diode (OLED), in the bottom emission type of OLED, light is emitted towards the base substrate;

each sub-pixel comprises a light-emitting region and a non-light-emitting region; a drive circuit is disposed in each sub-pixel; the drive circuit comprises a storage capacitor and a plurality of transistors; the plurality of transistors comprise a switch transistor, a drive transistor and a sense transistor;

for each sub-pixel, the plurality of transistors are located in the non-light-emitting region, the storage capacitor is a transparent capacitor, and there is an overlapping region between an orthographic projection of the storage capacitor on the base substrate and the light-emitting region; a first electrode of the storage capacitor is disposed in a same layer as an active layer of the plurality of transistors and in a different layer from source and drain electrodes of the plurality of transistors;

a first electrode of the drive transistor is extended towards a second electrode of the storage capacitor and is electrically connected to the second electrode of the storage capacitor located in a layer different from a layer where the first electrode of the drive transistor is located, and a first electrode of the sense transistor is extended towards the second electrode of the storage capacitor and is electrically connected to the second electrode of the storage capacitor located in the layer different from a layer where the first electrode of the sense transistor is located;

the display substrate further comprises a plurality of rows of gate lines and a plurality of columns of data lines disposed on the base substrate; wherein each sub-pixel is defined by intersection of a gate line and a data line, and the plurality of sub-pixels respectively correspond to the plurality of rows of gate lines and the plurality of columns of data lines; and the plurality of rows of gate lines comprise a first gate line and a second gate line;

the first gate line and the second gate line are disposed in a same layer as gate electrodes of the plurality of transistors, and the plurality of columns of data lines are disposed in a same layer as the source and drain electrodes of the plurality of transistors; and wherein the sense transistor is electrically connected to the second electrode of the transparent capacitor through a fourth via, and the drive transistor is electrically connected to the second electrode of the transparent capacitor through a third via, and the second electrode of the storage capacitor is located on a side of the first electrode close to the base substrate.

2. The display substrate according to claim 1, further comprising a buffer layer and a light shield layer disposed on a side of the active layer of the plurality of transistors close to the base substrate, wherein the light shield layer and the second electrode of the storage capacitor are disposed on a side of the buffer layer close to the base substrate; and an orthographic projection of the second electrode of the storage capacitor on the base substrate covers an orthographic projection of the light shield layer on the base substrate, and a surface of the light shield layer close to the second electrode of the storage capacitor is in complete contact with the second electrode.

3. The display substrate according to claim 2, wherein the light shield layer is disposed on a side of the second electrode of the storage capacitor close to the base substrate, or the second electrode of the storage capacitor is disposed on a side of the light shield layer close to the base substrate.

4. The display substrate according to claim 1, further comprising an interlayer insulating layer disposed between the source and drain electrodes of the plurality of transistors and the active layer of the plurality of transistors;

the buffer layer comprises a first via hole and a second via hole which expose the second electrode of the storage capacitor, and the interlayer insulating layer comprises the third via hole exposing the first via hole and the fourth via hole exposing the second via hole; and the first electrode of the drive transistor is connected to the second electrode of the storage capacitor through the first via hole and the third via hole, and the first electrode of the sense transistor is connected to the second electrode of the storage capacitor through the second via hole and the fourth via hole.

5. The display substrate according to claim 1, wherein for each sub-pixel, the first electrode of the storage capacitor is respectively connected to a first electrode of the switch transistor and a gate electrode of the drive transistor; and a gate electrode of the switch transistor is connected to the first gate line among the gate lines corresponding to the sub-pixel; a second electrode of the switch transistor is connected to a data line corresponding to the sub-pixel; and a gate electrode of the sense transistor is connected to the second gate line among the gate lines corresponding to the sub-pixel.

6. The display substrate according to claim 5, wherein for each sub-pixel, the non-light-emitting region comprises a first non-light-emitting region and a second non-light-emitting region, and the first non-light-emitting region and the second non-light-emitting region are located at two sides of the light-emitting region and are disposed along an extending direction of the plurality of columns of data lines; and the sense transistor and the second gate line are both located in the first non-light-emitting region, and the switch transistor, the drive transistor and the first gate line are all located in the second non-light-emitting region.

7. The display substrate according to claim 1, further comprising power supply lines and sensing lines disposed in a same layer as the plurality columns of data lines, and four of the plurality of sub-pixels form one pixel, the four sub-pixels are disposed along an extending direction of gate lines, and each pixel corresponds to two columns of power supply lines and one column of the sensing lines;

for each pixel, the sensing lines corresponding to the pixel is located between a second sub-pixel and a third sub-pixel, one column of the power supply lines corresponding to the pixel is located on a side of a first sub-pixel away from the second sub-pixel, and the other column of the power supply lines corresponding to the pixel is located on a side of a fourth sub-pixel away from the third sub-pixel;

a first data line corresponding to the first sub-pixel is located on a side of the first sub-pixel close to the second sub-pixel; a second data line corresponding to the second sub-pixel is located on a side of the second sub-pixel close to the first sub-pixel; a third data line corresponding to the third sub-pixel is located on a side of the third sub-pixel close to the fourth sub-pixel; and a fourth data line corresponding to the fourth sub-pixel close to the third sub-pixel;

power connection lines disposed in a same layer as gate electrodes of the plurality of transistors and sensing connection lines disposed in a same layer as the light shield layer; each pixel corresponds to two power connection lines disposed along the extending direction of the gate lines and two sensing connection lines disposed along the extending direction of the gate lines;

the power connection lines respectively correspond to the power supply lines, and the power connection lines are connected to the corresponding power supply lines; the two sensing connection lines are connected to two sensing lines;

a second electrode of a drive transistor of the second sub-pixel is connected to one of the power supply connection lines;

a second electrode of a drive transistor of the third sub-pixel is connected to the other one of the power supply connection lines;

a second electrode of the sense transistor of the first sub-pixel is connected to one of the sensing connection lines; and a second electrode of the sense transistor of the fourth sub-pixel is connected to the other one of the sensing connection lines.

8. The display substrate according to claim 7, wherein the buffer layer is further provided with a fifth via hole exposing at least one sensing connection line of the two sensing connection lines, and an interlayer insulating layer is further provided with a sixth via hole exposing the fifth via hole;

a second electrode of the sense transistor of the first sub-pixel is connected to the at least one sensing connection line through the fifth via hole and the sixth via hole.

9. The display substrate according to claim 8, further comprising a gate insulating layer disposed between the gate electrodes of the plurality of transistors and the active layer of the plurality of transistors;

wherein an orthographic projection of the gate insulating layer on the base substrate coincides with an orthographic projection of the gate electrodes of the plurality of transistors on the base substrate.

10. The display substrate according to claim 2, wherein manufacturing material of the first electrode of the storage capacitor comprises transparent metal oxide, and manufacturing material of the second electrode of the storage capacitor comprises a transparent conductive material.

11. The display substrate according to claim 9, wherein each sub-pixel is further provided with a light-emitting element and a filter of a same color as the sub-pixel; the light-emitting element further comprises an anode, an organic light-emitting layer and a cathode which are sequentially disposed, the anode is connected to the first electrode of the sense transistor, the anode is a transmission electrode and the cathode is a reflection electrode;

wherein there is an overlapping region between an orthographic projection of the light-emitting element on the base substrate and the light-emitting region, and the filter is located in the light-emitting region and is disposed on a side of the light-emitting element close to the base substrate; an orthographic projection of the anode on the base substrate covers an orthographic projection of the filter on the base substrate.

12. The display substrate according to claim 11, further comprising a passivation layer and a planarization layer disposed on a side of the source and drain electrodes of the plurality of transistors away from the base substrate;

the passivation layer is disposed on a side of the filter close to the base substrate, and the planarization layer is disposed between the light-emitting element and the filter; the passivation layer is provided with a seventh via hole exposing the first electrode of the sense transistor, and the planarization layer is provided with an eighth via hole exposing the seventh via hole;

the anode is connected to the first electrode of the sense transistor through the seventh via hole and the eighth via hole; and an orthographic projection of the eighth via hole on the base substrate does not completely coincide with an orthographic projection of the fourth via hole on base the substrate.

13. A display apparatus, comprising the display substrate according to claim 1.

14. A method for preparing the display substrate, which is used for preparing the display substrate according to claim 1, the method comprising:

providing the base substrate; and forming the plurality of sub-pixels on the base substrate, wherein each sub-pixel comprises the light-emitting region and the non-light-emitting region, and the drive circuit is provided in each sub-pixel;

the drive circuit comprises the storage capacitor and the plurality of transistors;

the plurality of transistors comprises the switch transistor, the drive transistor and the sense transistor, wherein for each sub-pixel, the plurality of transistors is located in the non-light-emitting region, the storage capacitor is the transparent capacitor, and there is the overlapping region between the orthographic projection of the storage capacitor on the base substrate and the light-emitting region;

the first electrode of the storage capacitor is disposed in the same layer as the active layer of the plurality of transistors and in the different layer from source and drain electrodes of the plurality of transistors, and the second electrode of the storage capacitor is located on one side of the first electrode close to the base substrate; and the first electrode of the drive transistor is extended towards the second electrode of the storage capacitor and is electrically connected to the second electrode of the storage capacitor located in the layer different from the layer where the first electrode of the drive transistor is located, and the first electrode of the sense transistor is extended towards the second electrode of the storage capacitor and is electrically connected to the second electrode of the storage capacitor located in the layer different from the layer where the first electrode of the sense transistor is located; and wherein the sense transistor is electrically connected to the second electrode of the transparent capacitor through a fourth via, and the drive transistor is electrically connected to the second electrode of the transparent capacitor through the third via, and the second electrode of the storage capacitor is located on a side of the first electrode close to the base substrate;

wherein the sense transistor is electrically connected to the transparent capacitor through the fourth via, and the drive transistor is electrically connected to the transparent capacitor through the third via.

15. The method according to claim 14, wherein the display substrate further comprises gate lines, the data line, a power supply line and a sensing line, wherein the gate line comprises a first gate line and a second gate line, and the step of forming the plurality of sub-pixels on the base substrate comprises:

forming a light shield layer and the second electrode of the storage capacitor on the base substrate;

forming the active layer of the plurality of transistors and the first electrode of the storage capacitor on the light shield layer and the second electrode;

forming gate electrodes of the plurality of transistors, the first gate line and the second gate line on the active layer of the plurality of transistors and the first electrode of the storage capacitor;

forming the data line, the power supply line, the sensing line and the source and drain electrodes of the plurality of transistors on the gate electrodes, the first gate line and the second gate line of the plurality of transistors; and sequentially forming a filter and a light-emitting element on the data line, the power supply line, the sensing line and the source and drain electrodes of the plurality of transistors.

16. The method according to claim 15, wherein, the step of forming the light shield layer and the second electrode of the storage capacitor on the base substrate comprise:

sequentially forming the light shield layer and the second electrode of the storage capacitor on the base substrate, or sequentially forming the second electrode of the storage capacitor and the light shield layer on the base substrate, or simultaneously forming the second electrode of the storage capacitor and the light shield layer on the base substrate.

17. The method according to claim 16, wherein the step of simultaneously forming the second electrode of the storage capacitor and the light shield layer on the base substrate comprises:

sequentially depositing a light shielding thin film and a transparent conductive thin film on the base substrate; and simultaneously forming the second electrode of the storage capacitor and the light shield layer by using a halftone mask.

18. The method according to claim 15, wherein the steps of forming the active layer of the plurality of transistors and the first electrode of the storage capacitor on the light shield layer and the second electrode; forming the gate electrodes of the plurality of transistors, the first gate line and the second gate line on the active layer of the plurality of transistors and the first electrode of the storage capacitor; forming the data line, the power supply line, the sensing line and the source and drain electrodes of the plurality of transistors on the gate electrodes of the plurality of transistors, the first gate line and the second gate line comprise:

forming a buffer layer comprising a first via hole, a second via hole and a fifth via hole on the light shield layer and the second electrode of the storage capacitor, wherein the first via hole and the second via hole expose the second electrode of the storage capacitor, and the fifth via hole exposes a sensing connection line;

forming the active layer of the plurality of transistors and the first electrode of the storage capacitor on the buffer layer by using a same process;

forming the gate electrodes of the plurality of transistors, the first gate line and the second gate line on the active layer of the plurality of transistors and the first electrode of the storage capacitor;

forming an interlayer insulating layer comprising the third via hole, the fourth via hole and a sixth via hole on the gate electrodes of the plurality of transistors, the first gate line and second gate line, wherein the third via hole exposes the first via hole, the fourth via hole exposes the second via hole, and the sixth via hole exposes the fifth via hole; and forming the data line, the power supply line, the sensing line and the source and drain electrodes of the plurality of transistors on the interlayer insulating layer;

or, forming a first insulating thin film on the light shield layer and the second electrode of the storage capacitor;

forming the active layer of the plurality of transistors and the first electrode of the storage capacitor on the first insulating thin film by using the same process;

forming the gate electrodes of the plurality of transistors, the first gate line and the second gate line on the active layer of the plurality of transistors and the first electrode of the storage capacitor;

forming a second insulating thin film on the gate electrodes of the plurality of transistors, the first gate line and the second gate line; and processing the first insulating thin film and the second insulating thin film by using a patterning process to form the buffer layer comprising the first via hole, the second via hole and the fifth via hole and the interlayer insulating layer comprising the third via hole, the fourth via hole and the sixth via hole.

19. The method according to claim 15, wherein, the step of sequentially forming the filter and the light-emitting element on the data line, the power supply line, the sensing line and the source and drain electrodes of the plurality of transistors comprises:

forming a passivation layer comprising a seventh via hole on the data line, the power supply line, the sensing line and the source and drain electrodes of the plurality of transistors, wherein the seventh via hole exposes the first electrode of the sense transistor;

sequentially forming the filter and a planarization layer comprising an eighth via hole on the passivation layer, wherein the eighth via hole exposes the seventh via hole; and forming the light-emitting element on the planarization layer.

* * * * *